(12) United States Patent
Choi et al.

(10) Patent No.: US 11,651,824 B2
(45) Date of Patent: May 16, 2023

(54) MEMORY DEVICE AND METHOD OF OPERATING THE MEMORY DEVICE

(71) Applicant: SK hynix Inc., Icheon-si (KR)

(72) Inventors: Hyung Jin Choi, Icheon-si (KR); Yeong Jo Mun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 66 days.

(21) Appl. No.: 17/218,637

(22) Filed: Mar. 31, 2021

(65) Prior Publication Data

US 2022/0108750 A1 Apr. 7, 2022

(30) Foreign Application Priority Data

Oct. 6, 2020 (KR) .................. 10-2020-0128804

(51) Int. Cl.
| | | |
|---|---|---|
| *G11C 16/10* | (2006.01) | |
| *G11C 16/26* | (2006.01) | |
| *G11C 16/08* | (2006.01) | |
| *G11C 16/34* | (2006.01) | |
| *G11C 16/24* | (2006.01) | |
| *G11C 16/30* | (2006.01) | |

(52) U.S. Cl.
CPC .............. *G11C 16/10* (2013.01); *G11C 16/08* (2013.01); *G11C 16/24* (2013.01); *G11C 16/26* (2013.01); *G11C 16/30* (2013.01); *G11C 16/3404* (2013.01)

(58) Field of Classification Search
CPC ......... G11C 16/10; G11C 16/08; G11C 16/24; G11C 16/26; G11C 16/30; G11C 16/3404; G11C 2211/5641; G11C 11/5628; G11C 16/0483
USPC .................................................. 365/185.22
See application file for complete search history.

(56) References Cited

U.S. PATENT DOCUMENTS

| | | | |
|---|---|---|---|
| 2014/0126298 A1* | 5/2014 | Jeon .................... | G11C 11/5635 365/185.24 |
| 2016/0371026 A1* | 12/2016 | Shim ................... | G11C 16/3445 |
| 2017/0263327 A1* | 9/2017 | Lee ..................... | G11C 16/3459 |
| 2019/0189215 A1* | 6/2019 | Yang ...................... | G11C 16/24 |

FOREIGN PATENT DOCUMENTS

| | | |
|---|---|---|
| KR | 1020180009580 A | 1/2018 |
| KR | 1020180029430 A | 3/2018 |

\* cited by examiner

*Primary Examiner* — Hoai V Ho
*Assistant Examiner* — Minh Dinh
(74) *Attorney, Agent, or Firm* — William Park & Associates Ltd.

(57) ABSTRACT

The present technology includes a memory device and a method of operating the memory device. The memory device includes a memory block including memory cells, a peripheral circuit configured to perform a plurality of program loops to cause a threshold voltage of selected memory cells included in a selected page among the memory cells to attain a target voltage, and a control logic circuit configured to control the peripheral circuit to perform the program loops by selectively applying a normal program or a double program to the program loops.

24 Claims, 20 Drawing Sheets

FIG. 11

| Vpgm | (DPGM) MAXn |
|---|---|
| 1Vpgm ~ EVpgm | L |
| (E+1)Vpgm ~ FVpgm | M |
| (F+1)Vpgm ~ GVpgm | N |

(E<F<G)　　　　(L<M<N)

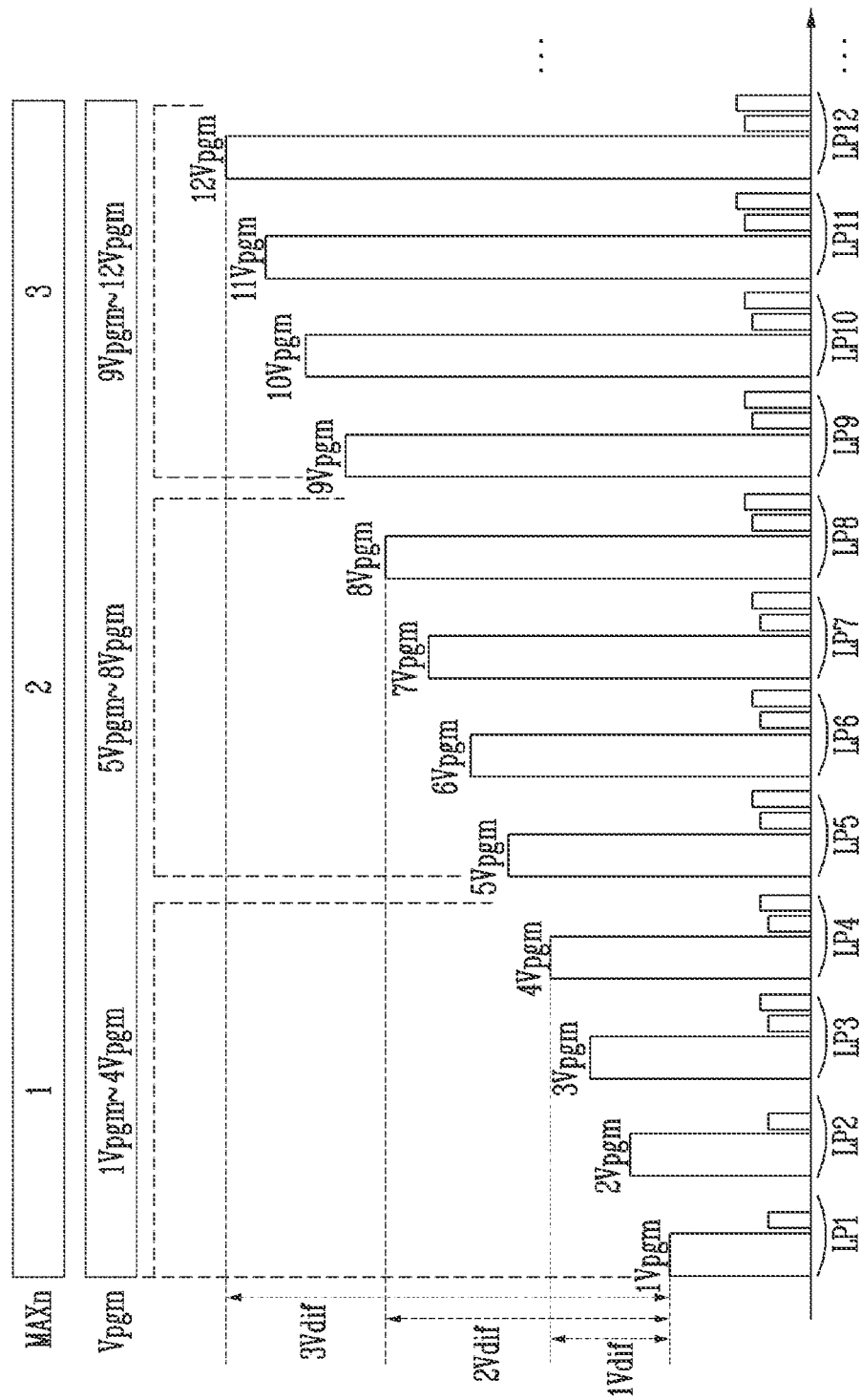

| Vst | (DPGM) MAXn |
|---|---|
| A Vst | L |
| B Vst | M |
| C Vst | N |

(A<B<C)  (L<M<N)

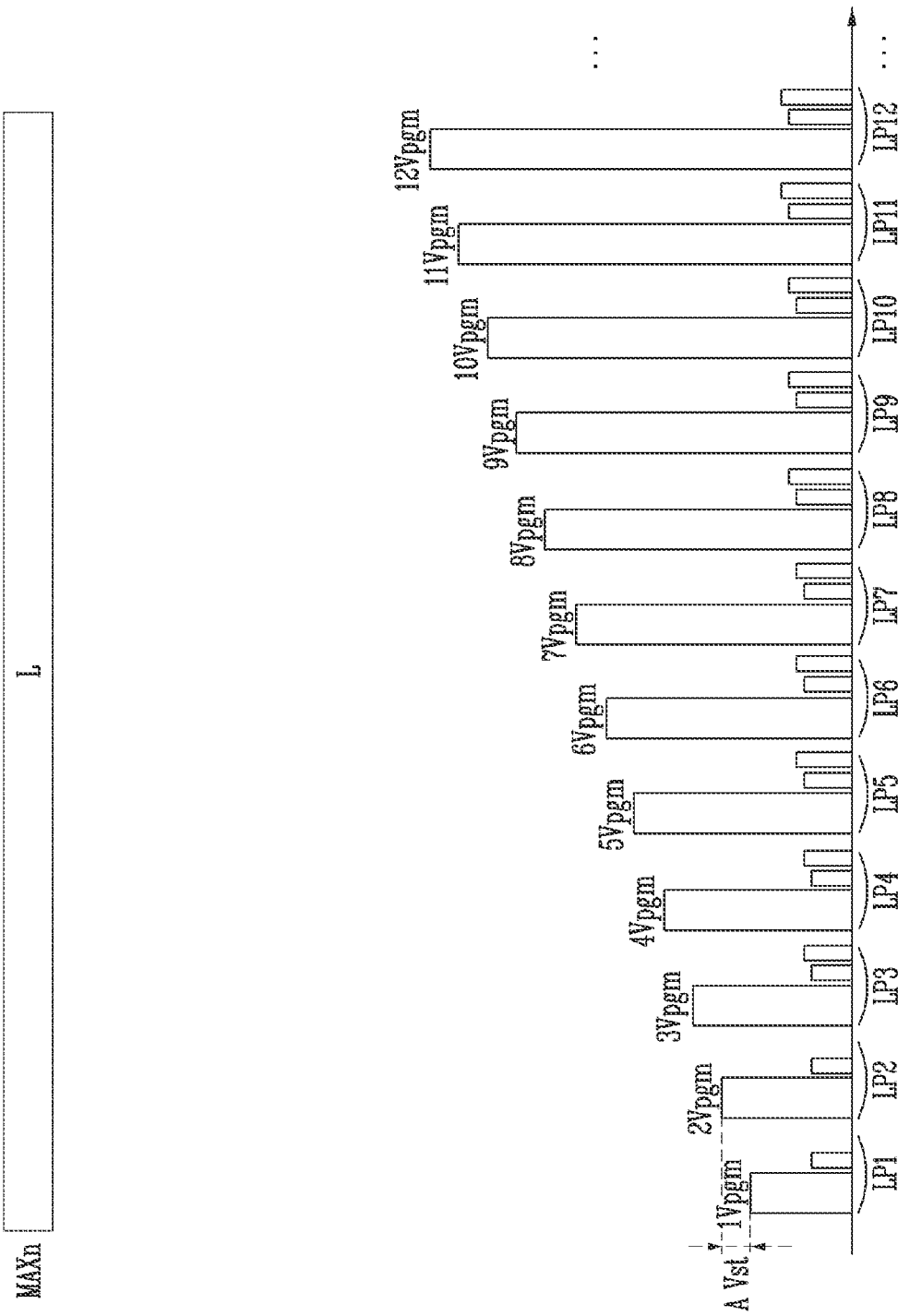

FIG. 16

| RG | (DPGM) MAXn |
|---|---|
| 1RG | L |
| 2RG | M |
| 3RG | N |

(L<M<N)

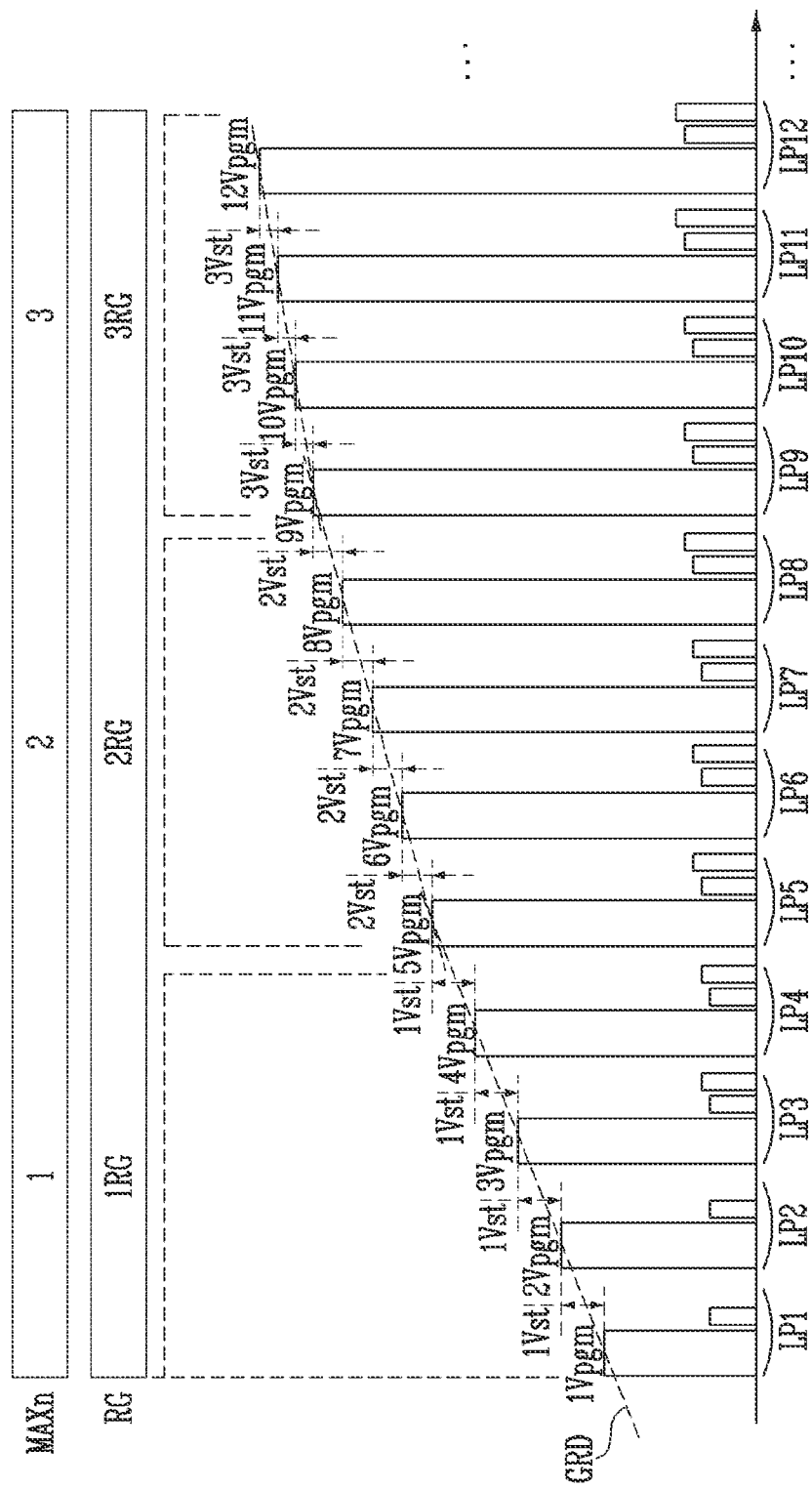

FIG. 18A

| PV | (DPGM) MAXn |
|---|---|
| PV1~PV4 | L |
| PV5~PV7 | N |

| PV | (DPGM) MAXn |
|---|---|
| PV1 | L |
| PV2, PV3 | M |
| PV4, PV5 | N |
| PV6, PV7 | P |

(L<M<N<P)

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2020-0128804 filed on Oct. 6, 2020, in the Korean Intellectual Property Office, the entire disclosure of which is incorporated by reference herein.

BACKGROUND

1. Technical Held

The present disclosure relates to a memory device and a method of operating the memory device, and more particularly, to a memory device capable of performing a program operation.

2. Related Art

A memory device may include a volatile memory device in which stored data is destroyed when power supply is cut off, and a nonvolatile memory device in which stored data is maintained even though the power supply is cut off.

The volatile memory device may include a dynamic random-access memory (DRAM) and a static random-access memory (SRAM). The nonvolatile memory device may include a read only memory (ROM), a programmable read only memory (PROM), an erasable PROM (EPROM), an electrically EPROM (EEPROM a NAND FLASH, and the like.

The memory device may include a memory cell array, peripheral circuits, and a control logic circuit.

The memory cell array may include a plurality of memory cells, and the plurality of memory cells may store data. A method of storing one bit of data in one memory cell is referred to as a single level cell (SLC) method, and a method of storing two or more bits of data in one memory cell is referred to as a multi-level cell (MLC) method, A program operation of the MLC method may be classified into a triple level cell (TLC) method or a quadruple level cell (QLC) method according to the number of bits stored in the memory cell. In the TLC method, three bits of data may be stored in one memory cell, and in the QLC method, four bits of data may be stored in one memory cell.

SUMMARY

A memory device according to an embodiment of the present disclosure may include a memory block including memory cells, a peripheral circuit configured to perform a plurality of program loops to cause a threshold voltage of selected memory cells included in a selected page among the memory cells to attain a target voltage, and a control logic circuit configured to control the peripheral circuit to perform the program loops by selectively applying a normal program or a double program to the program loops, and changing a maximum number of times the double program is applied according to an operation condition of the program loops. The normal program may increase the threshold voltage of the selected memory cells by a first change amount. The double program may increase the threshold voltage by a second change amount lower than the first change amount.

A method of operating a memory device according to an embodiment of the present disclosure may include performing a plurality of program loops of programming selected memory cells by applying a program voltage, that increases, to a selected word line to which the selected memory cells are connected. When the program voltage is equal to or lower than a reference level, a maximum number of times a double program for increasing a threshold voltage between a target voltage and a sub verify voltage lower than the target voltage slower than a reference is used is set as a first number of times, and when the program voltage is higher than the reference level, the maximum number of times is set as a second number of times greater than the first number of times.

A method of operating a memory device according to an embodiment of the present disclosure may include performing a program operation of selected memory cells by applying a program voltage, that increases, to a selected word line to which the selected memory cells are connected. In an initial period of the program operation, a maximum number of times a double program for increasing a threshold voltage between a target voltage and a sub verify voltage lower than the target voltage slower than a reference is used is set as a first number of times, and the maximum number of times is increased to a second number of times greater than the first number of times as the program operation proceeds.

A method of operating a memory device according to an embodiment of the present disclosure may include performing a plurality of program loops of programming selected memory cells by applying a program voltage, that increases, to a selected word line to which the selected memory cells are connected. When a target voltage of the memory cells is equal to or lower than a reference level, a maximum number of times a double program for increasing a threshold voltage between the target voltage and a sub verify voltage lower than the target voltage slower than a reference is used is set as a first number of times, and when the target voltage of the memory cells is higher than the reference level, the maximum number of times is set as a second number of times greater than the first number of times.

BRIEF DESCRIPTION OF THE DRAWINGS

FIG. 11 is a diagram illustrating a program operation according to a first embodiment of the present disclosure.

FIG. 12 is a diagram illustrating program loops of the program operation performed according to the first embodiment of the present disclosure.

FIGS. 15A, 15B, and 15C are diagrams illustrating program loops of the program operation performed according to the second embodiment of the present disclosure.

FIG. 16 is a diagram illustrating a program operation according to a third embodiment of the present disclosure.

FIG. 17 is a diagram illustrating program loops of the program operation performed according to the third embodiment of the present disclosure.

FIGS. 18A and 18B are diagrams illustrating a program operation according to a fourth embodiment of the present disclosure.

DETAILED DESCRIPTION

An embodiment of the present disclosure provides a memory device capable of improving a threshold voltage distribution of memory cells during a program operation, and a method of operating the same.

The present technology may improve a threshold voltage distribution of memory cells during a program operation.

Figure 1:
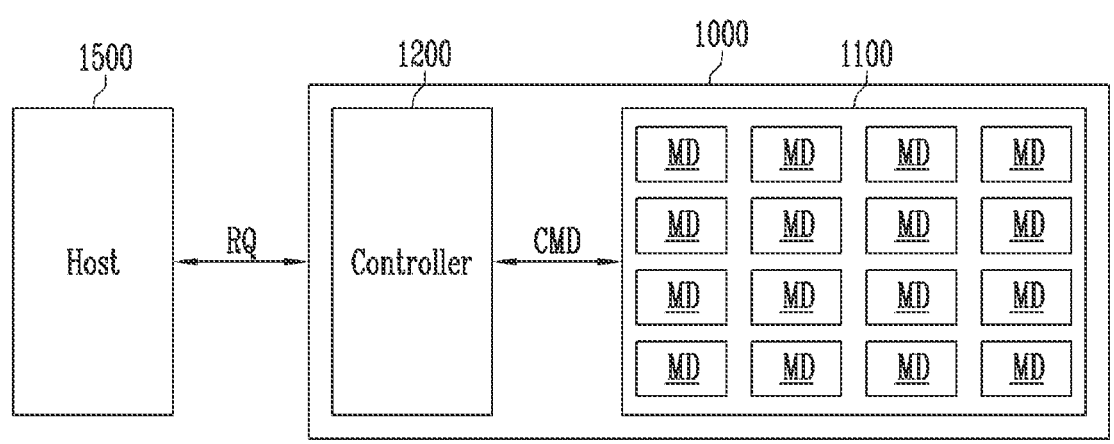
FIG. 1 is a diagram illustrating a memory system according to an embodiment of the present disclosure.

FIG. 1 is a diagram illustrating a memory system according to an embodiment of the present disclosure.

Referring to FIG. 1, the memory system 1000 may include a storage device 1100 and a controller 1200. The storage device 1100 may include a plurality of memory devices MD, and the memory devices MD may be connected to the controller 1200 through input/output lines.

The controller 1200 may communicate between a host 1500 and the memory device MD. The controller 1200 may generate a command CMD for controlling the memory devices MD according to a request RQ of the host 1500, and even though the request RQ of the host 1500 is not present, the controller 1200 may perform a background operation for improving performance of the memory system 1000.

The host 1500 may generate the requests RQ for various operations and may output the generated requests RQ to the memory system 1000. For example, the requests RQ may include a program request that may control a program operation, a read request that may control a read operation, an erase request that may control an erase operation, and the like.

The host 1500 may communicate with the memory system 1000 through various interfaces such as peripheral component interconnect express (PCIe), advanced technology attachment (ATA), serial ATA (SATA), parallel ATA (PATH), serial attached SCSI (SAS), nonvolatile memory express (NVMe) a universal serial bus (USB), a multi-media card (MMC), an enhanced small disk interface (ESDI), or integrated drive electronics (IDE).

The memory devices MD according to the present embodiment may perform the program operation. The program operation may be performed in an incremental step pulse program (ISPP) method in which a program voltage is gradually increased. In the present embodiment, the memory devices MD may perform a program operation of the ISPP method in which a normal program method and a double program method is selectively applied or the normal program method and the double program method are selectively mixed.

The normal program method is a method of applying a program allowance voltage to selected bit lines and applying a program inhibition voltage to unselected bit lines when a program voltage is applied to a selected word line. The selected word line refers to a word line to which program target memory cells are connected. The selected bit lines refer to bit lines connected to memory cells of which a threshold voltage is lower than a target voltage, and the unselected bit lines refer to bit lines connected to memory cells of which a threshold voltage is increased to be equal to or higher than the target voltage. The program allowance voltage may be a voltage having a large potential difference from the program voltage applied to the selected word line, and may be, for example, 0 V, The program inhibition voltage may be a voltage having a small potential difference from the program voltage, and may be, for example, a positive voltage of 18 V or more.

The double program method is a method of applying the program allowance voltage to bit lines connected to memory cells having a large difference between the threshold voltage and the target voltage among the selected bit lines, applying a program decrease voltage to bit lines connected to memory cells having a small difference between the threshold voltage and the target voltage, and applying the program inhibition voltage to the unselected bit lines, when the program voltage is applied to the selected word line. For convenience of description, the bit lines connected to the memory cells having the large difference between the threshold voltage and the target voltage may be defined as first state bit lines, and the bit lines connected to the memory cells having the relatively small difference between the threshold voltage and the target voltage may be defined as second state bit lines. The program decrease voltage may be a voltage for slowly increasing the threshold voltage of the memory cells connected to the second state bit lines than the threshold voltage of the memory cells connected to the first state bit lines. For example, the program decrease voltage may be set to a positive voltage between the program inhibition voltage and the program allowance voltage.

Figure 2:
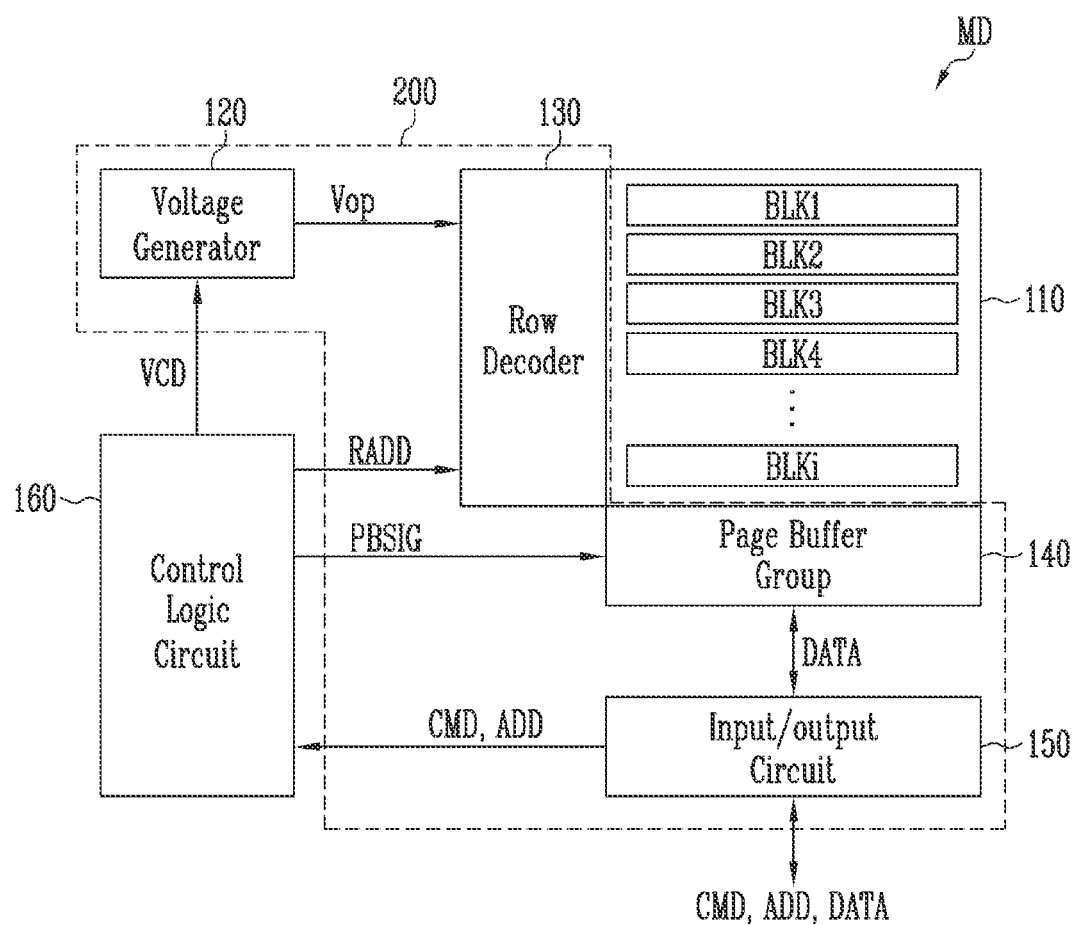
FIG. 2 is a diagram illustrating a memory device according to an embodiment of the present disclosure.

FIG. 2 is a diagram illustrating the memory device according to an embodiment of the present disclosure.

Referring to FIG. 2, the memory device MD may include a memory cell array 110 in which data is stored, a peripheral circuit 200 that performs a program, read, or erase operation, and a control logic circuit 160 that controls the peripheral circuit 200.

The memory cell array 110 may include a plurality of memory blocks BLK1 to BLKi in which data is stored, Each of the memory blocks BLK1 to BLKi may include a plurality of memory cells, and the memory cells may be implemented in a two-dimensional structure arranged in parallel to a substrate or a three-dimensional structure stacked in a vertical direction on the substrate.

The peripheral circuit 200 may include a voltage generator 120, a row decoder 130, a page buffer group 140, and an input/output circuit 150.

The voltage generator 120 may generate and output operation voltages Vop required for various operations in response to a voltage code VCD. For example, the voltage generator 120 may generate and output a program voltage, a verify voltage, a read voltage, a pass voltage, an erase voltage, and the like having various levels.

The row decoder 130 may select one memory block among the memory blocks BLK1 to BLKi included in the memory cell array 110 according to a row address RADD, and transmit the operation voltages Vop to the selected memory block.

The page buffer group 140 may be connected to the memory cell array 110 through bit lines. For example, the page buffer group 140 may include page buffers connected to the respective bit lines. The page buffers may operate simultaneously in response to page buffer control signals PBSIG, and may temporarily store data during the program or read operation. The verify operation performed during the program operation and the verify operation performed during the erase operation may be performed in a method the same as the read operation.

During the read operation or the verify operation, the page buffers may sense a voltage of bit lines, which vary according to a threshold voltage of the memory cells. That is, it may be determined whether the threshold voltage of the memory cells are lower than or higher than the read voltage or the verify voltage according to a result of the sensing operation performed in the page buffers. During the program operation of the normal program method, the page buffers may apply the program allowance voltage to the selected bit lines and apply the program inhibition voltage to the unselected bit lines. During the program operation of the double program method, the page buffers may apply the program allowance voltage to the first state bit lines, apply the program decrease voltage to the second state bit lines, and apply the program inhibition voltage to the unselected bit lines.

The input/output circuit 150 may be connected to the controller 1200 of FIG. 1 through input/output lines. The input/output circuit 150 may input/output a command CMD, an address ADD, and data DATA through the input/output lines. For example, the input/output circuit 150 may transmit the command CMD and the address ADD received through the input/output lines to the control logic circuit 160, and transmit the data DATA received through the input/output lines to the page buffer group 140. The input/output circuit 150 may output the data DATA received from the page buffer group 140 to the controller 1200 through the input/output lines.

The control logic circuit 160 may output the voltage code VCD, the row address RADD, the page buffer control signals PBSIG, and a column address CADD in response to the command CMD and the address ADD. For example, the control logic circuit 160 may include software that performs an algorithm in response to the command CMD, and hardware configured to output various signals according to the address ADD and the algorithm.

The control logic circuit 160 may adjust the number of times the double program is applied according to operation conditions during the program operation of a selected page among a plurality of pages included in a selected memory block. In an embodiment, operation conditions may include at least one of the program voltage, a step voltage, a section of a program loop (i.e., see FIG. 16), and the target voltage.

Figure 3:
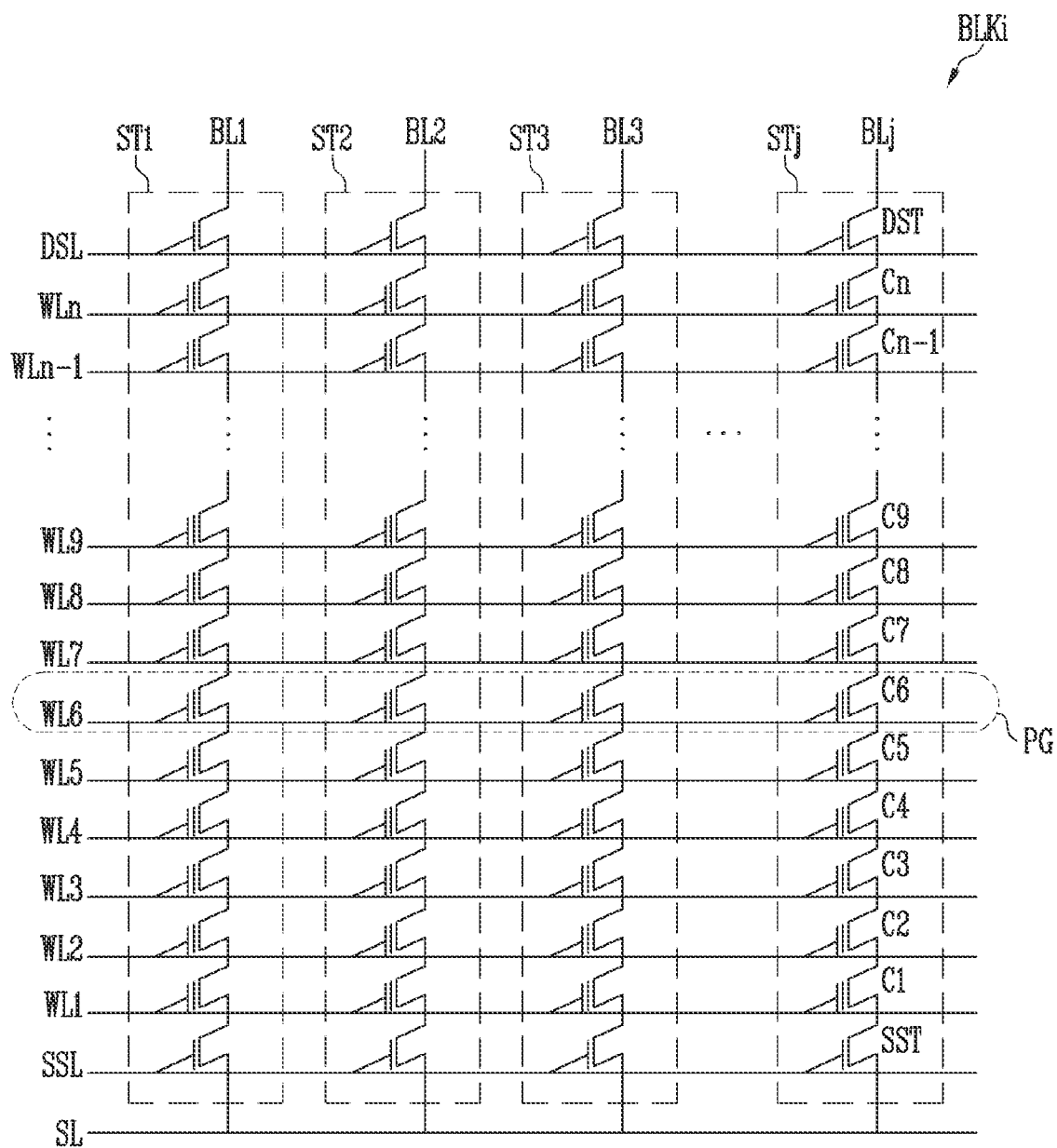
FIG. 3 is a diagram illustrating a memory block according to an embodiment of the present disclosure.

FIG. 3 is a diagram illustrating the memory block according to an embodiment of the present disclosure, and an i-th memory block BLKi is shown as an example among the plurality of memory blocks BLK1 to BLKi shown in FIG. 2.

Referring to FIG. 3, the i-th memory block BLKi may include a plurality of strings ST1 to STj (j is a positive integer). The first to j-th strings ST1 to STj may be connected between bit lines BL1 to BLj and a source line SL. For example, the first string ST1 may be connected between the first bit line BL1 and the source line SL, the second string ST2 may be connected between the second bit line BL2 and the source line SL, and the j-th string STj may be connected between the j-th bit line BLj and the source line SL.

Each of the first to j-th strings ST1 to STj nay include a source select transistor SST, a plurality of memory cells C1 to Cn, and a drain select transistor DST. Although not shown in the drawing, dummy cells may be further included between the memory cells C1 to Cn and the source or drain select transistors SST or DST. A configuration of the string is specifically described as follows using the j-th string STj as an example.

The source select transistor SST included in the j-th string STj may electrically connect or disconnect between the source line SL and the first memory cell C1 according to a voltage applied to the source select line SSL. Gates of the first to n-th memory cells C1 to Cn may be connected to first to n-th word lines WL1 to WLn, respectively. The drain select transistor DST may electrically connect or disconnect between the j-th bit line BLj and the n-th memory cell Cn according to a voltage applied to the drain select line DSL. Gates of the source select transistors SST included in the different strings ST1 to STj may be commonly connected to the source select line SSL, and gates of the first to n-th memory cells C1 to Cn may be connected to the first to n-th word lines WL1 to WLn, and gates of the drain select transistors DST may be commonly connected to the drain select line DSL. A group of memory cells connected to the same word line is referred to as a page PG, and the program and read operations may be performed in a unit of the page PG.

The program operation according to the present embodiment may be performed in an incremental step pulse program (ISPP) method in which the program voltage is gradually increased. In the program operation of the ISPP method, a plurality of program loops may be performed until the threshold voltage of the selected memory cells increases to the target voltage, and the program voltage may be gradually increased each time the program loop is performed. In each of the program loops, a sub program operation for increasing the threshold voltage of the selected memory cells and a verify operation for determining whether the threshold voltage of the selected memory cells is increased to the target voltage may be performed. In the sub program operation, the program voltage may be applied to the selected word line, and in the verify operation, the verify voltage may be applied to the selected word line. An operation of determining whether the verify operation is passed or failed according to data of the memory cells sensed in the verify operation may be performed in the sub program operation of a next program loop. The operation of determining whether the verify operation is passed or failed during the sub program operation may be a current sensing check operation.

Figure 4:
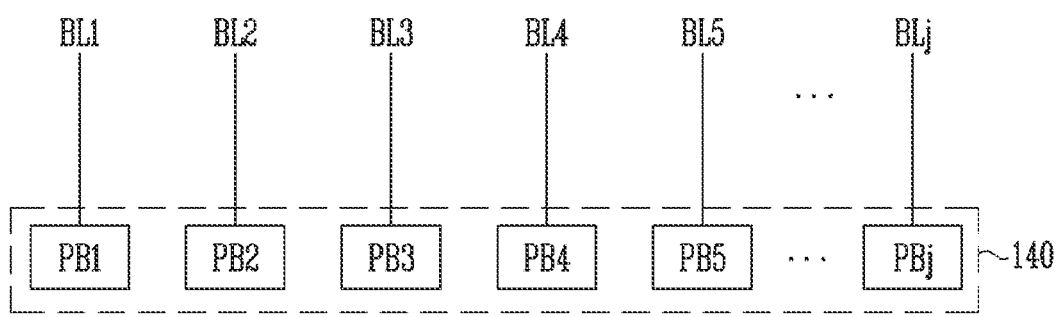
FIG. 4 is a diagram illustrating a page buffer group according to an embodiment of the present disclosure.

FIG. 4 is a diagram illustrating a page buffer group according to an embodiment of the present disclosure.

Referring to FIG. 4, the page buffer group 140 may include first to j-th page buffers PB1 to PBj. The first to j-th page buffers PB1 to PBj may be connected to the first to j-th bit lines BL1 to BLj, respectively. When the program operation starts, the first to j-th page buffers PB1 to PBj may store data output from the controller 1200 of FIG. 1, and may selectively apply the program allowance voltage, the program decrease voltage, or the program inhibition voltage to the first to j-th bit lines BL1 to BLj according to the stored data. After the program operation starts, the first to j-th page buffers PB1 to PBj may selectively apply the program allowance voltage, the program decrease voltage, or the program inhibition voltage to the first to j-th bit lines BL1 to BLj according to the stored data and the data sensed from the selected memory cells during the verify operation. For example, the program allowance voltage may be 0 V, and the program decrease voltage may be a positive voltage higher than the program allowance voltage. The program inhibition voltage may be a positive voltage higher than the program decrease voltage, FIG. 5 is a diagram illustrating a page buffer according to an embodiment of the present disclosure, and the j-th page buffer PBj shown in FIG. 4 is shown as an example.

Figure 5:
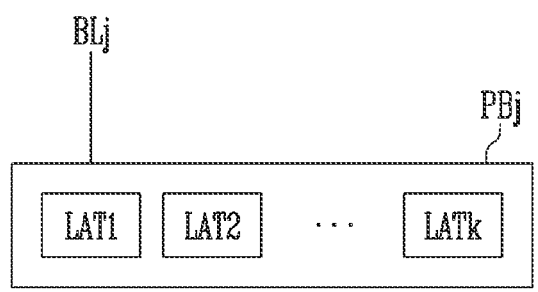
FIG. 5 is a diagram illustrating a page buffer according to an embodiment of the present disclosure.

Referring to FIG. 5, the j-th page buffer PBj may include a plurality of latches LAT1 to LATk. Some of the plurality of latches LAT1 to LATk may store data received from the controller, and others may store data sensed during the verify operation. The j-th page buffer PBj may apply the program allowance voltage, the program decrease voltage, or the program inhibition voltage to the j-th bit line BLj according to the data sensed during the verify operation and the data received from the controller.

Figure 6:
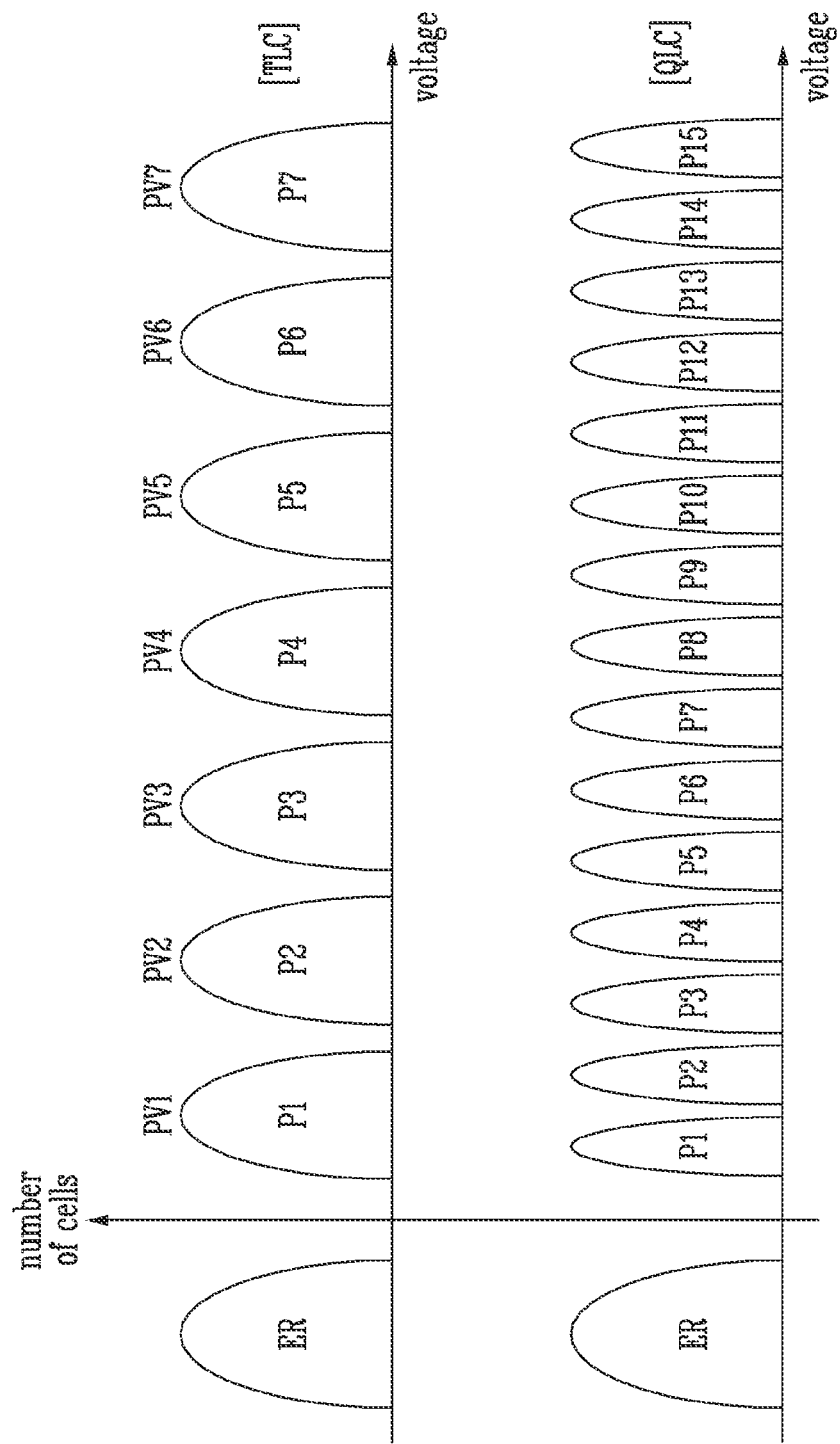
FIG. 6 is a diagram illustrating a threshold voltage distribution of memory cells.

FIG. 6 is a diagram illustrating a threshold voltage distribution of memory cells.

Referring to FIG. 6, the program operation may be divided into various methods according to the number of bits stored in the memory cell. For example, a method of storing three bits of data in one memory cell is referred to as a triple level cell (TLC) method, and a method of storing four bits of data in one memory cell is referred to as a quadruple level cell (QLC) method.

In the TLC method, the state of the memory cells may have any one of one erase state ER and seven program states P1 to P7. In the QLC method, the state of the memory cells may have any one of one erase state ER and fifteen program states P1 to P15.

When the TLC method is described as an example, the first to seventh program states P1 to P7 may be divided into different first to seventh target voltages PV1 to PV7. As the number of target voltages increases, an interval between threshold voltage distributions of memory cells to be programmed to different program states decreases, Therefore, in the present embodiment, a program operation for preventing an increase of a distribution width of a threshold voltage is presented.

Figure 7:
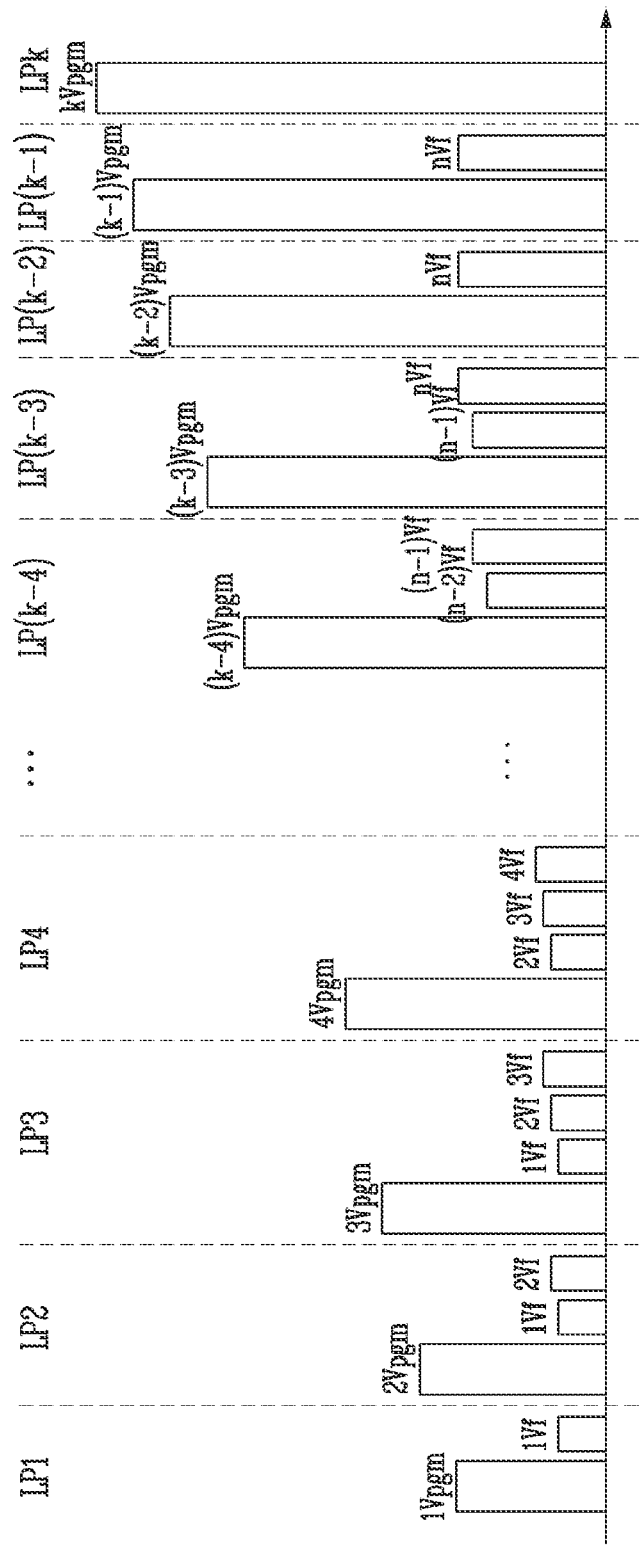
FIG. 7 is a diagram illustrating a program operation according to an embodiment of the present disclosure.

FIG. 7 is a diagram illustrating a program operation according to an embodiment of the present disclosure.

Referring to FIG. 7, the program operation of the memory cells included in the selected page may be performed in an incremental step pulse program (ISPP) method. The program operation of the ISPP method may increase the threshold voltage of the memory cells by performing a plurality of program loops. For example, each time the program loop is performed, the program voltage applied to the selected word line may be gradually increased. The threshold voltage of the memory cells may also be gradually increased by gradually increasing the program voltages.

As shown in FIG. 7, a case where first to k-th program loops LP1 to LPk are performed is described as follows.

In the first program loop LP1, a sub program operation in which a first program voltage 1Vpgm is applied to the selected word line may be performed, and a verify operation for determining whether the threshold voltage of the memory cells connected to the selected word line is increased to the target voltage may be performed. In the present embodiment, the verify operation using a first verify voltage 1Vf is defined as a first verify operation. In the sub program operation of the first program loop LP1, the lowest first program voltage 1Vpgm may be used, and in the first verify operation, the lowest first verify voltage 1Vf among the verify voltages applied to the selected word line may be used. During the sub program operation, the threshold voltage of the memory cells may be increased by the first program voltage 1Vpgm applied to the selected word line. Since electrical characteristics of the memory cells may be different from each other, when the first verify operation is performed, the memory cells of which the threshold voltage is increased to a first target voltage and the memory cells of which the threshold voltage is lower than the first target voltage may be distinguished. Voltages to be applied to the bit lines may be set up for a next program loop according to a sensing result of the first verify operation.

When the second program loop LP2 is started, a sub program operation using a second program voltage 2Vpgm higher than the first program voltage 1Vpgm may be performed. In the sub program operation, the voltages set up in the first program loop LP1 may be applied to the bit lines, and a second program voltage 2Vpgm may be applied to the selected word line. In the sub program operation performed from the second program loop LP2, a current sensing check operation for determining whether the first verify operation performed in the first program loop LP1 which is a previous loop is passed or failed may be performed. For example, in the verify operation, data of the memory cells may be sensed to distinguish between the memory cells of which the threshold voltage is increased to the target voltage and the memory cells of which the threshold voltage is lower than the target voltage, and in the current sensing check operation, whether all threshold voltage of the selected memory cells reach respective target voltages may be determined. Therefore, a verify operation to be performed in the program loop may be determined according to a result of the current sensing check operation. For example, in the current sensing check operation performed during the sub program operation performed in the second program loop LP2, when it is determined that the first verify operation performed in the first program loop LP1 is failed, the first verify operation may be performed again in the second program loop LP2. In addition, after the first verify operation is performed, a second verify operation for determining a second program state may be successively performed. The second verify operation may be a verify operation using a second verify voltage 2Vf higher than the first verify voltage 1Vf, and may be performed to verify memory cells to be programmed to the second program state higher than a first program state. In the drawing shown in FIG. 7, the second verify operation is started from the second program loop LP2. However, since this is an example for describing the program operation of the ISPP method, a time point at which the verify operations corresponding to each of the program states may be different according to the memory device.

When the first and second verify operations are performed in the second program loop LP2 as well, voltages to be applied to the bit lines may be set up for a next program loop according to a results of the first and second verify operations.

When all threshold voltage of the selected memory cells included in the selected page are increased to the target voltages in such a method, the program operation of the selected page may be ended. For example, when a result of a current sensing check operation on an n-th verify operation performed in the k-th program loop LPk is determined as a pass, the program operation of the selected page may be ended.

Figure 8:
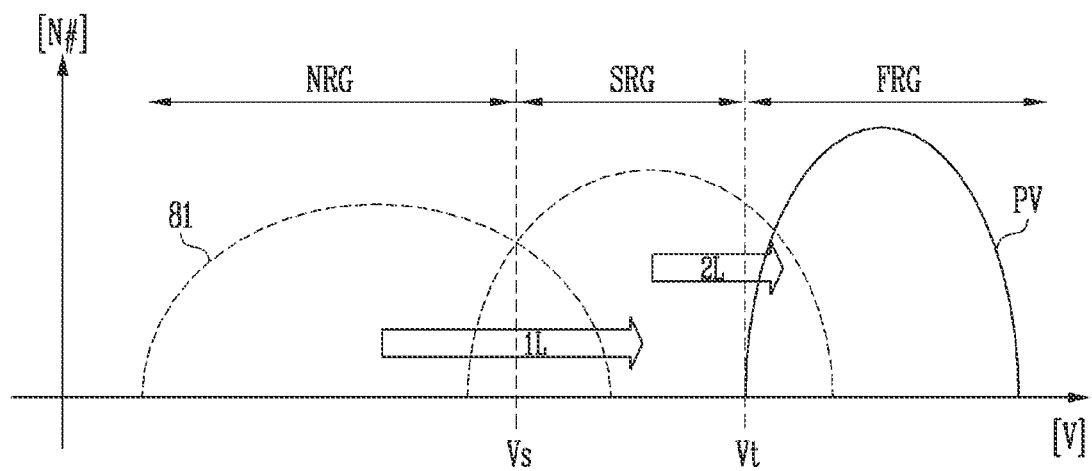
FIG. 8 is a diagram illustrating a program operation of a double program method according to an embodiment of the present disclosure.

FIG. 8 is a diagram illustrating a program operation of a double program method according to an embodiment of the present disclosure.

Referring to FIG. 8, in the double program method, two or more verify voltages Vs and Vt may be set for each target voltage PV, and the selected memory cells may be programmed until a threshold voltage 81 of the selected memory cells is higher than the target verify voltage Vt. In the present embodiment, a program operation in which the sub verify voltage Vs and the target verify voltage Vt are used as the verify voltage is described. The sub verify voltage Vs may be set to a level lower than the target verify voltage Vt.

In the program operation of the double program method, after a sub verify operation using the sub verify voltage Vs is performed, a main verify operation using the target verify voltage Vt may be performed, Therefore, the selected memory cells may be included in a normal section NRG in which the threshold voltage is lower than the sub verify voltage Vs, a slow section SRG in which the threshold voltage is between the sub verify voltage Vs and the target verify voltage Vt, and an end section FRG in which the threshold voltage is equal to or higher than the target verify voltage Vt.

Since the normal section NRG is a section in which a difference between the threshold voltage of the memory cells and the target verify voltage Vt is great, the program allowance voltage may be applied to the bit lines connected to the memory cells included in the normal section NRG during the sub program operation.

Since the slow section SRG is a section in which the difference between the threshold voltage of the memory cells and the target verify voltage Vt is relatively less than the difference between the threshold voltage of the memory cells included in the normal section NRG and the target verify voltage Vt, the program decrease voltage higher than the program allowance voltage may be applied to the bit lines connected to the memory cells included in the slow section SRG during the sub program operation.

Since the end section FRG is a section in which the threshold voltage of the memory cells is higher than the target verify voltage Vt, the program inhibition voltage higher than the program decrease voltage may be applied to the bit lines connected to the memory cells included in the end section FRG during the sub program operation.

Among the above-described sections, in the slow section SRG, since the program decrease voltage higher than the program allowance voltage is applied to the bit lines, the threshold voltage of the memory cells may be increased with the voltage difference less than that of the threshold voltage of the memory cells included in the normal section NRG. For example, in a case where the same program voltage is applied to the memory cells included in each of the normal section NRG and the slow section SRG, when the threshold voltage of the memory cells included in the normal section NRG is increased by a first level 1L, the threshold voltage of the memory cells included in the slow section SRG may be increased by a second level 2L lower than the first level 1L.

In the slow section SRG, since the threshold voltage of the memory cells is increased more slowly than that in the normal section NRG, as the number of memory cells included in the slow section SRG increases, a time required for the program operation may increase. Therefore, in the present embodiment, the number of times of the program operation of the double program method in which the program decrease voltage is applied to the bit lines of the memory cells included in the slow section SRG may be changed according to a condition of the program operation.

In an operation to which the double program method is not applied, the normal program method may be applied.

The program loop performed in the program operation is more specifically described as follows.

Figure 9:
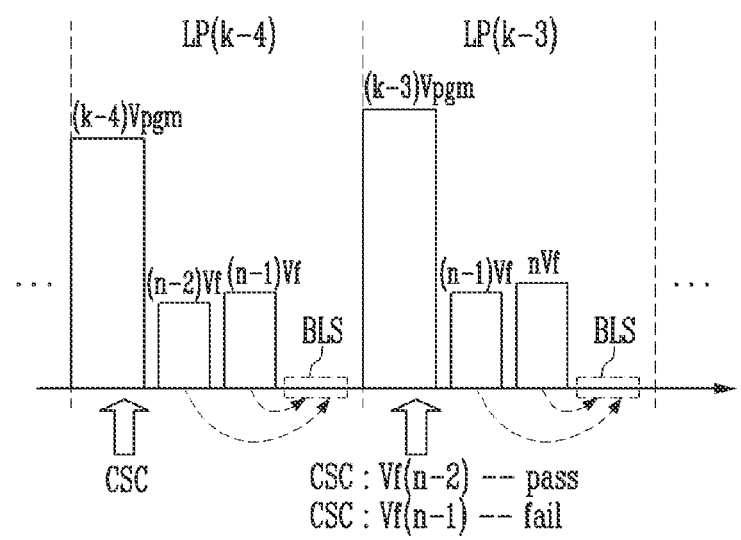
FIG. 9 is a diagram illustrating a program loop according to an embodiment of the present disclosure.

FIG. 9 is a diagram illustrating a program loop according to an embodiment of the present disclosure.

Referring to FIG. 9, a (k−4)-th program loop LP(k−4) and a (k−3)-th program loop LP(k−3) are shown as an example. In the (k−4)-th program loop LP(k−4), a sub program operation in which a (k−4)-th program voltage (k−4)Vpgm is applied to the selected word line may be performed. Subsequently, (n−2)-th and (n−1)-th verify operations using (n−2)-th and (n−1)-th verify voltages (n−2)Vf and (n−1)Vf, respectively, may be sequentially performed. During the sub program operation of the (k−4)-th program loop LP(k−4), a current sensing check CSC operation for determining a result of each of the verify operations performed in a previous program loop may be performed. When it is determined that both of the (n−2)-th and (n−1)-th verify operations are failed as a result of the current sensing check CSC operation, the (n−2)-th and (n−1)-th verify operations may be performed in the (k−4)-th program loop LP(k−4). After the (n−2)-th and (n−1)-th verify operations are performed, a bit line setup operation BLS for a next program loop may be performed according to a result of the (n−2)-th and (n−1)-th verify operations. For example, the bit lines to which the program allowance voltage, the program decrease voltage, and the program inhibition voltage are applied may be selected.

When the (k−3)-th program loop LP(k−3) is started, the sub program operation may be performed. During the sub program operation, voltages set up in the (k−4)-th program loop LP(k−4) may be applied to the bit lines, and a (k−3)-th program voltage (k−3)Vpgm higher than the (k−4)-th program voltage (k−4)Vpgm may be applied to the selected word line. During the sub program operation, the current sensing check CSC operation on each of the (n−2)-th and (n−1)-th verify operations performed in the (k−4)-th program loop LP(k−4) may be performed. For example, when the (n−2)-th verify operation using the (n−2)-th verify voltage (n−2)Vf is passed, and the (n−1)-th verify operation using the (n−1)-th voltage (n−1)Vf is failed, the (n−2)-th verify operation may be omitted and the (n−1)-th verify operation and an n-th verify operation may be performed from the (k−)-th program loop LP(k−3). The n-th verify operation may be an operation using an n-th verify voltage nVf. After the (n−1)-th verify operation and an n-th verify operation are performed, the bit line setup operation BLS may be performed according to a sensing result of the (n−1)-th verify operation and an n-th verify operation.

Figure 10A:
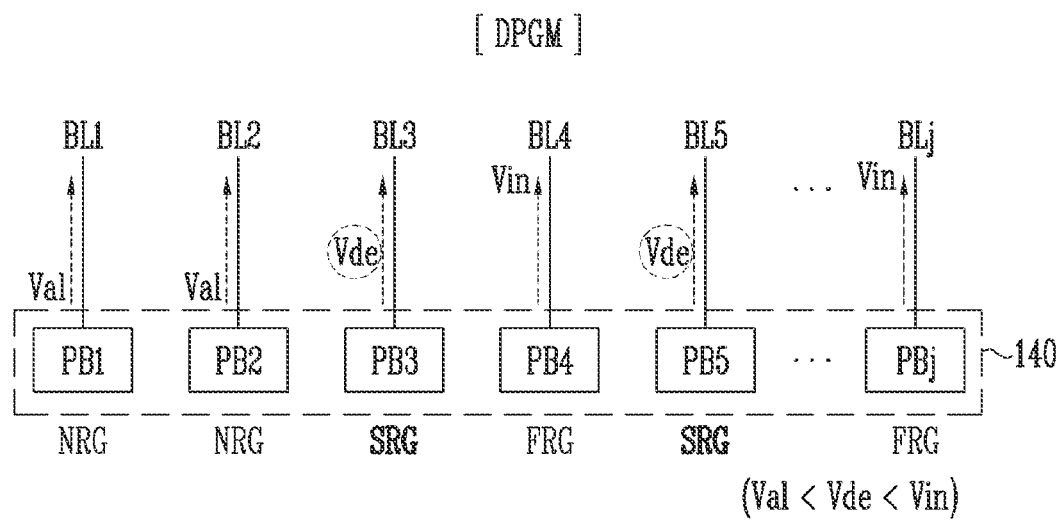
FIGS. 10A and 10B are diagrams illustrating a method of applying a voltage to bit lines according to an embodiment of the present disclosure.
Figure 10B:
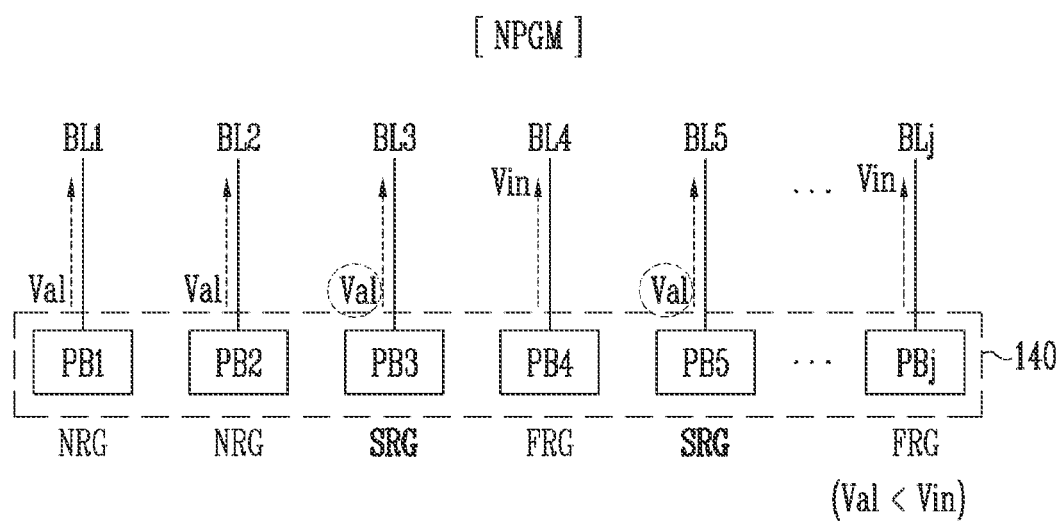

FIGS. 10A and 10B are diagrams illustrating a method of applying a voltage to bit lines according to an embodiment of the present disclosure. FIG. 10A illustrates voltages applied to the bit lines in a double program DPGM, and FIG. 10B illustrates voltages applied to the bit lines in a normal program operation NPGM.

Referring to FIG. 10A, during a sub program operation to which the double program DPGM method is applied, a program allowance voltage Val, a program decrease voltage Vde, and a program inhibition voltage Vin may be selectively applied to the bit lines. For example, it is assumed that the memory cells connected to the first and second page buffers PB1 and PB2 are memory cells included in the normal section NRG, the memory cells connected to the third and fifth page buffers PB3 and PB5 are memory cells included in the slow section SRG, and the memory cells connected to the fourth and j-th page buffers PB4 and PBj are memory cells included in the end section FRG.

The program allowance voltage Val may be applied to the bit lines connected to the memory cells included in the normal section NRG, the program decrease voltage Vde may be applied to the bit lines connected to the memory cells included in the slow section SRG, and the program inhibition voltage Vin may be applied to the bit lines connected to the memory cells included in the end section FRG.

Referring to FIG. 10B, during a sub program operation to which the normal program NPGM method is applied, the program allowance voltage Val and the program inhibition voltage yin may be selectively applied to the bit lines. For example, when the double program DPGM method is applied as shown in FIG. 10A in a previous program loop and the normal program NPGM method is applied as shown in FIG. 103 in a next program loop, the program allowance voltage Val may be applied to the bit lines connected to the memory cells included in the slow section SRG.

In the present embodiment, the number of times the double program DPGM is applied may be adjusted according to the program operation. Therefore, a program operation time may be shorted and the threshold voltage distribution of the memory cells may be improved.

FIG. 11 is a diagram illustrating a program operation according to a first embodiment of the present disclosure.

Referring to FIG. 11, in the first embodiment, the maximum number of times MAXn of the double program DPGM may be determined according to the program voltage Vpgm. When the program voltage Vpgm is equal to or lower than a reference level, the maximum number of times MAXn that the double program DPGM is applied may be set to be small, and when the program voltage Vpgm is higher than the reference level, the maximum number of times MAXn that the double program DPGM is applied may be set to be large. Here, one or more reference levels may be set.

For example, when the reference level is set to an E-th program voltage EVpgm and an F-th program voltage FVpgm, in program loops using from the first program voltage 1Vpgm of which the voltage is lowest to the E-th program voltage EVpgm, the maximum number of times MAXn of the double program DPGM may be set to L number of times. In program loops using from an (E+1)-th program voltage (E+1)Vpgm to the F-th program voltage FVpgm as voltage levels, the maximum number times MAXn of the double program DPGM may be set to M number of times more than L number of times. In program loops using from an (F+1)-th program voltage (F+1)Vpgm to a G-th program voltage GVpgm as the voltage levels, the maximum number times MAXn of the double program DPGM may be set to N number of tines more than M number of times, Therefore, the (E+1)-th program voltage (E+1)Vpgm is higher than the E-th program voltage EVpgm, and the (F+1)-th program voltage (F+1)Vpgm is higher than the F-th program voltage FVpgm, F is a positive integer greater than E, and G is a positive integer greater than F. M is a positive integer greater than L, and N is a positive integer greater than M. Values set according to the first embodiment may be stored in the control logic circuit 160 of FIG. 2, and the control logic circuit 160 may control the program loops to which the double program DPGM is applied according to the stored setting value.

The program operation to which the first embodiment is applied is specifically described as follows.

FIG. 12 is a diagram illustrating program loops of the program operation performed according to the first embodiment of the present disclosure.

Referring to FIG. 12, when first to twelfth program loops LP1 to LP12 are performed in the program operation on the selected page, in the first to fourth program loops LP1 to LP4 having a relative low voltage level, the maximum number of times MAXn of the double program DPGM may be set to 1, in the fifth to eighth program loops LP5 to LP8 having an intermediate voltage level, the maximum number of times MAXn of the double program DPGM may be set to 2, and in the ninth to twelfth program loops LP9 to LP12 having a relatively high voltage level, the maximum number of times MAXn of the double program DPGM may be set to 3. In other words, in the program loops in which a program voltage within a first voltage difference 1Vdiff from the first program voltage 1Vpgm having the lowest voltage level is applied, the maximum number of times MAXn of the double program DPGM may be set to 1, in the program loops in which a program voltage between the first voltage difference 1Vdiff and a second voltage difference 2Vdiff greater than the first voltage difference 1Vdiff from the first program voltage 1Vpgm having the lowest voltage level, the maximum number of times MAXn of the double program DPGM may be set to 2, and in the program loops in which a program voltage between the second voltage difference 2Vdiff and a third voltage difference 3Vdiff greater than the second voltage difference 2Vdiff from the first program voltage 1Vpgm having the lowest voltage level, the maximum number of times MAXn of the double program DPGM may be set to 3. That is, in a case where the number of times the double program DPGM is applied increases when the level of the program voltage is low, the program operation time increases accordingly. Therefore, in the first embodiment, when the level of the program voltage is low, the maximum number of times MAXn of the double program DPGM may be decreased, and as the level of the program voltage increases, the maximum number of times MAXn of the double program DPGM may be increased so that the distribution of the threshold voltage does not widen.

An embodiment in which the double program DPGM of which the maximum number of times MAXn is determined is performed is more specifically described as follows.

Figure 13A:
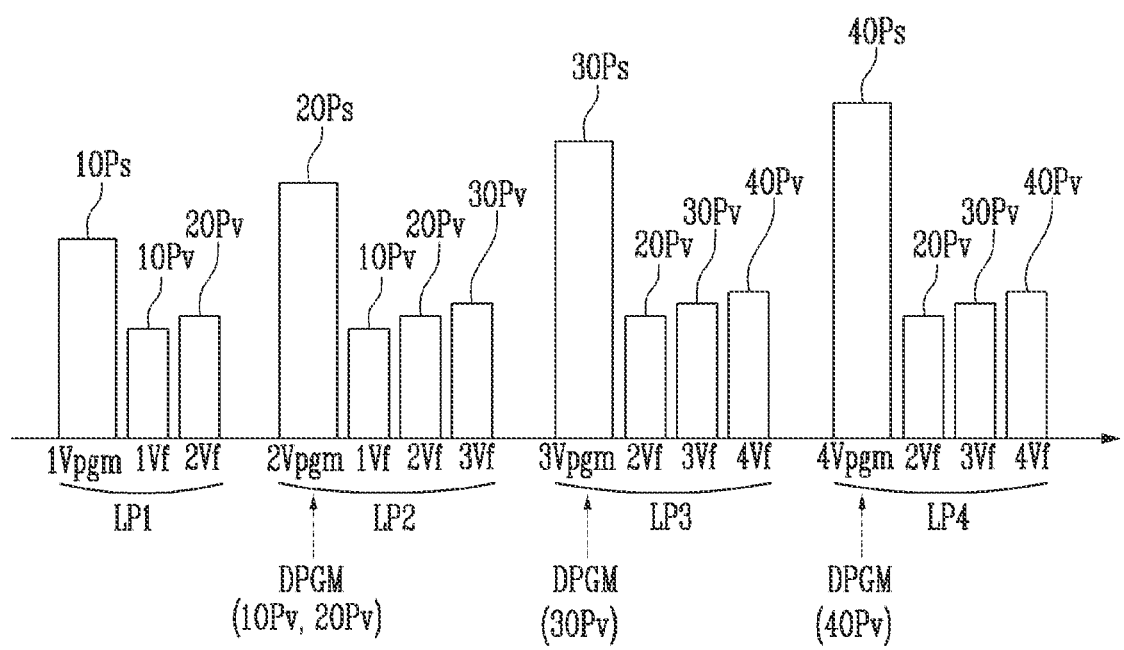
FIGS. 13A and 13B are diagrams illustrating a sub program operation according to the maximum number of times of a double program during the program operation according to the first embodiment of the present disclosure.
Figures 13B, 14:
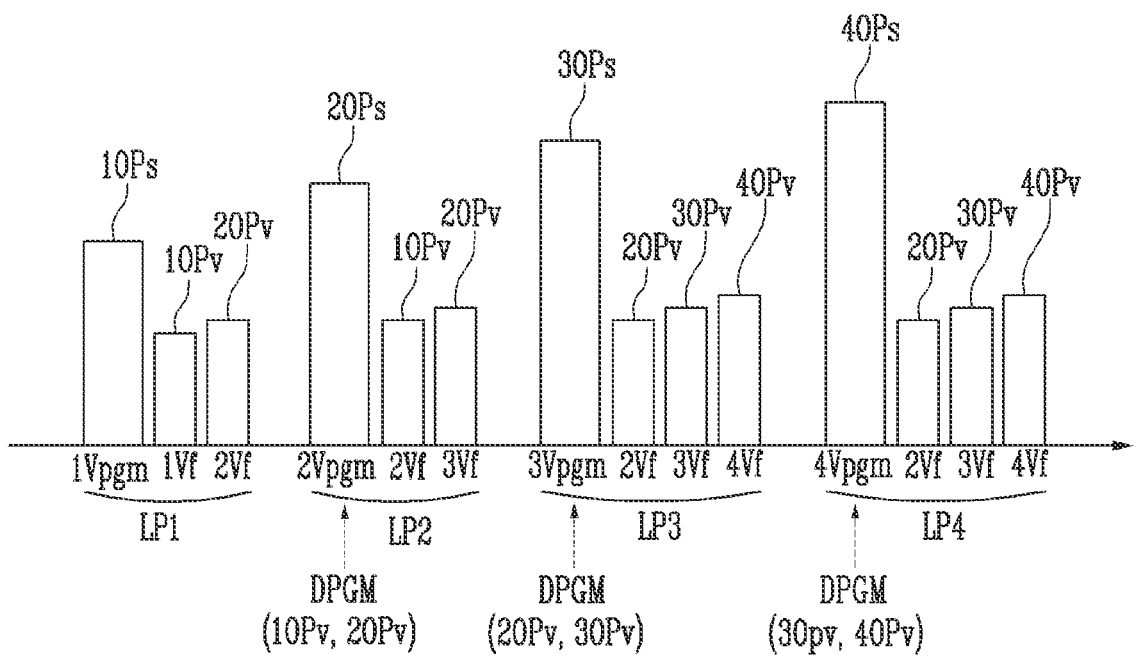
FIG. 14 is a diagram illustrating a program operation according to a second embodiment of the present disclosure.

FIGS. 13A and 13B are diagrams illustrating a sub program operation according to the maximum number of times of the double program during the program operation according to the first embodiment of the present disclosure.

Referring to FIG. 13A, when the maximum number of times MAXn of the of double program is set to once in the first to fourth program loops LP1 to LP4, a double program DPGM operation corresponding to each the verify operations using different verify voltages may be performed at most once. For example, while the first to fourth program loops LP1 to LP4 are performed, a double program DPGM reflecting a sensing result of a first verify operation 1OPv may be set to be performed in the second program loop LP2 and not to be performed in the remaining first, third, and fourth program loops LP1, LP3, and LP4. While the first to fourth program loops LP1 to LP4 are performed, a double program DPGM reflecting a sensing result of a second verify operation 2OPv may be set to be performed in the second program loop LP2 and not to be performed in the remaining first, third, and fourth program loops LP1, LP3, and LP4. While the first to fourth program loops LP1 to LP4 are performed, a double program DPGM reflecting a sensing result of a third verify operation 3OPv may be set to be performed in the third program loop LP3 and not to be performed in the remaining first, second, and fourth program loops LP1, LP2, and LP4. While the first to fourth program loops LP1 to LP4 are performed, a double program DPGM reflecting a sensing result of a fourth verify operation 4OPv may be set to be performed in the fourth program loop LP4 and not to be performed in the remaining first to third program loops LP1 to LP3.

More specifically, it is assumed that a first sub program operation 1OPs using the first program voltage 1Vpgm, the first verify operation 1OPv using the first verify voltage 1Vf and the second verify operation 2OPv using the second verify voltage 2Vf are performed in the first program loop LP1 and a second sub program operation 2OPs using the second program voltage 2Vpgm, the first verify operation 1OPv using the first verify voltage 1Vf, the second verify operation 2OPv using the second verify voltage 2Vf, and a third verify operation 3OPv using a third verify voltage 3Vf are sequentially performed in the second program loop LP2.

The voltage applied to the bit lines during the second sub program operation 2OPs may be set up according to a sensing result of the first and second verify operations 1OPv and 2OPv performed in the first program loop LP1, the set up voltage may be applied to the bit lines during the second sub program operation 2OPs of the second program loop LP2. When the double program DPGM is applied to the second sub program operation 2Ops, each of the double program DPGM according to the sensing result of the first verify operation 1OPv and the double program DPGM according to the sensing result of the second verify operation 2OPv may be applied once.

Since the double program DPGM corresponding to the first verify operation 1 OPv is applied in the second program loop LP2, even though the first verify operation 1OPv is performed in the remaining third and fourth program loops LP3 and LP4, the double program DPGM corresponding to the first verify operation 1OPv is not applied.

Since the double program DPGM corresponding to the second verify operation 2OPv is applied in the second program loop LP2, even though the second verify operation 2OPv is performed in the remaining third and fourth program loops LP3 and LP4, the double program DPGM corresponding to the second verify operation 2OPv is not applied.

When the first to third verify operations 1OPv to 3OPv using the first to third verify voltages 1Vf to 3Vf are performed in the second program loop LP2, in the third program loop LP3, the memory cells on which the first to third verify operations 1OPv to 3OPv are performed become targets of the double program DPGM, However, in the present embodiment, since the double program DPGM corresponding to each of the first and second verify operations 1OPv and 2OPv is already applied once, which is the maximum number of times MAXn, in the second program loop LP2, in the third program loop LP3, the double program DPGM corresponding to the first and second verify operations 1OPv and 2OPv might not be applied and only the double program DPGM corresponding to the third verify operation 3OPv may be applied.

When second to fourth verify operations 2OPv to 4OPv respectively using the second to fourth verify voltages 2Vf to 4Vf are performed in the third program loop LP3, in the fourth program loop LP4, the memory cells on which the second to fourth verify operations 2OPv to 4OPv are performed become the targets of the double program DPGM. However, in the present embodiment, since the double program DPGM corresponding to each of the second and third verify operations 2OPv and 3OPv is already applied once, which is the maximum number of times MAXn, in the previous loops, in the fourth program loop LP4, only the double program DPGM corresponding to the fourth verify operation 4OPv may be applied.

FIG. 13B illustrates a case where the maximum number of times MAXn of the double program is set to twice in the first to fourth program loops LP1 to LP4.

Referring to FIG. 13B, while the first to fourth program loops LP1 to LP4 are performed, the double program DPGM corresponding to the first verify operation 1OPv may be performed once in the second program loop LP2, the double program DPGM corresponding to the second verify operation 2OPv may be applied once in each of the second and third program loops LP2 and LP3, that is, twice in total, the double program DPGM corresponding to the third verify operation 3OPv may be applied once in each of the third and fourth program loops LP3 and LP4, that is twice in total, and the double program DPGM corresponding to the fourth verify operation 4OPv may be applied once in the fourth program loop LP4, In a case of the embodiment shown in FIG. 13B, since the first verify operation 1OPv is performed only in the first program loop LP1, the first verify operation 1OPv may be applied once only in the second program loop LP2. That is, when the maximum number of times MAXn of the double program DPGM is set to twice, the double program DPGM corresponding to each verify operation may be applied once or twice.

FIG. 14 is a diagram illustrating a program operation according to a second embodiment of the present disclosure.

Referring to FIG. 14, in the second embodiment, the maximum number of times MAXn of the double program DPGM may be determined according to a step voltage Vst. Here, the step voltage Vst means an increase amount of the program voltage that gradually increases each time the program loop is performed. For example, in a program operation in which an A step voltage A Vst is set, the maximum number of times MAXn of the double program DPGM may be set to L number of times, in a program operation in which a B step voltage B Vst higher than the A step voltage A Vst is set, the maximum number of times MAXn of the double program DPGM may be set to M number of times greater than L number of times, and in a program operation in which a C step voltage C Vst higher than the B step voltage B Vst is set, the maximum number of times MAXn of the double program DPGM may be set to N number of times greater than M number of times. Here, L, M, and N may be different positive integers.

That is, the maximum number of times MAXn of the double programs DPGM used in the program operation may be proportional to a level of the step voltage. The program operation to which the second embodiment is applied is specifically described as follows, FIGS. 15A to 15C are diagrams illustrating the program loops of the program operation performed according to the second embodiment of the present disclosure.

Referring to FIG. 15A, in a program operation in which the program voltage is constantly increased gradually by the A step voltage A Vst, it is assumed that the maximum number of times MAXn of the double program DPGM is L number of times. In program loops LP1 to LP12, and . . . performed in such a program operation, since the maximum number of times MAXn of the double program DPGM is limited to L number of times, the double program DPGM may be performed even less than L number of times according to the program loop.

Figure 15B:
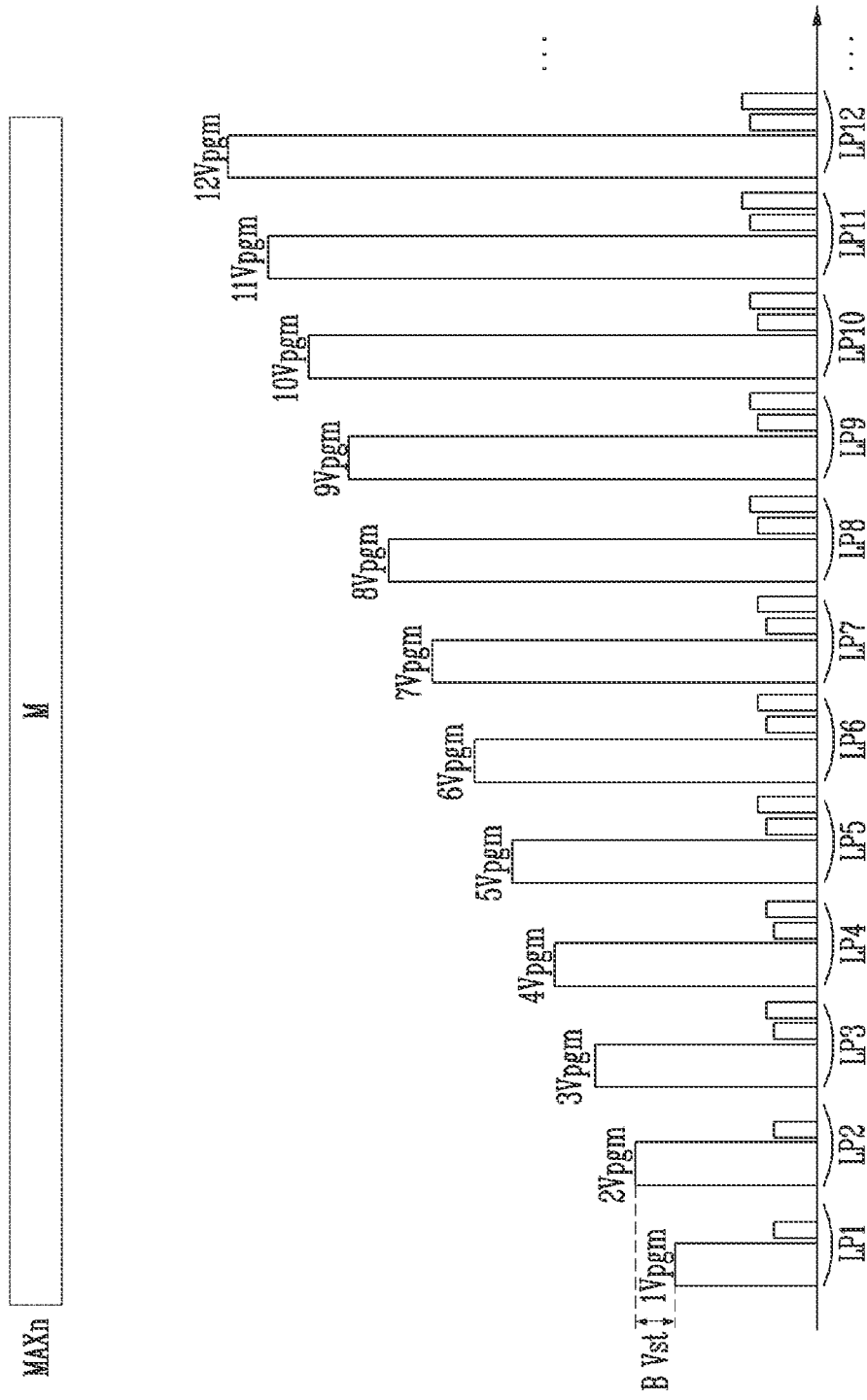

Referring to FIG. 15B, in a program operation in which the program voltage is constantly increased gradually by the B step voltage B Vst higher than the A step voltage A Vst, the maximum number of times MAXn of the double program DPGM may be set to M number of times greater than L number of times. In the program loops LP1 to LP12, and . . . performed in such a program operation, since the maximum number of times MAXn of the double program DPGM is limited to NI number of times, the double program DPGM may be performed even less than M number of times according to the program loop.

Figure 15C:
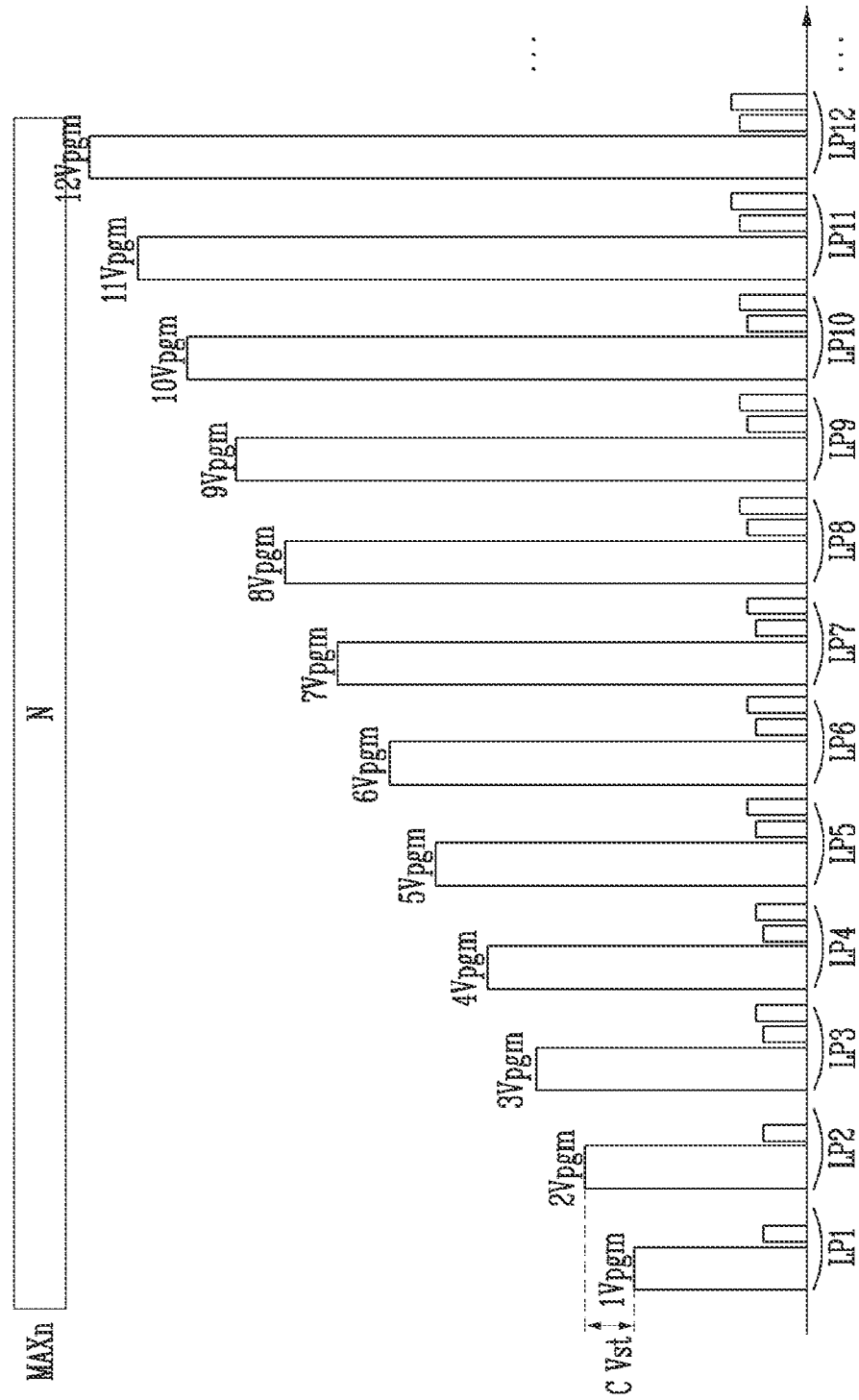

Referring to FIG. 15C, in a program operation in which the program voltage is constantly increased gradually by the C step voltage C Vst higher than the B step voltage B Vst, the maximum number of times MAXn of the double program DPGM may be set to N number of times greater than M number of times. In the program loops LP1 to LP12, and . . . performed in such a program operation, since the maximum number of times MAXn of the double program DPGM is limited to N number of times, the double program DPGM may be performed even less than N number of times according to the program loop, FIG. 16 is a diagram illustrating a program operation according to a third embodiment of the present disclosure.

Figure 16:
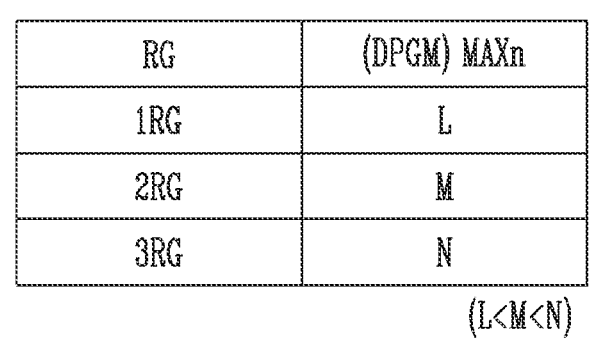

Referring to FIG. 16, in the third embodiment, the maximum number of times MAXn of the double program DPGM may be determined according to a section RG of the program loop. Here, the section RG means a section according to an order of the program loop. For example, the first section RG may correspond to an initial period of the program operation, the second section 2RG may correspond to a middle period of the program operation, and the third section 3RG may correspond to a late period of the program operation.

In the program loops performed in the first section 1RG, the maximum number of times MAXn of the double program DPGM may be set to L number of times, in the program loops performed in the second section 2RG, the maximum number of times MAXn of the double program DPGM may be set to M number of times, and in the program loops performed in the third period 3RG, the maximum number of times MAXn of the double program DPGM may be set to N number of times. Here, M may be a positive integer greater than L, and N may be a positive integer greater than M.

That is, since there are many memory cells which are in an erase state in the initial period of the program operation, the number of times the double program DPGM, which slowly increases the threshold voltage of the memory cells, is applied may be set to be less than those of other sections in order to quickly increase the threshold voltage of the memory cells. Since the threshold voltage of the memory cells is increased close to the target voltage in the late period of the program operation, the number of times the double program DPGM is applied may be set to be greater than those of other sections in order to slowly increase the threshold voltage of the memory cells.

The program operation to which the third embodiment is applied is specifically described as follows.

FIG. 17 is a diagram illustrating program loops of the program operation performed according to the third embodiment of the present disclosure.

Referring to FIG. 17, when the first to twelfth program loops LP1 to LP12 are performed in the program operation on the selected page, the first to fourth program loops LP1 to LP4 may be performed in the first section 1RG, which is the initial period of the program operation, the fifth to eighth program loops LP5 to LP8 may be performed in the second section 2RG, which is the middle period of the program operation, and the ninth to twelfth program loops LP9 to LP12 may be performed in the third section 3RG, which is the late period of the program operation. In the first to fourth program loops LP1 to LP4 performed in the first section 1RG, the maximum number of times of the double program DPGM may be set to 1, in the fifth to eighth program loops LP5 to LP8 performed in the second section 2RG, the maximum number of times of the double program DPGM may be set to 2, and in the ninth to twelfth program loops LP9 to LP12 performed in the third section 3RG, the maximum number of times of the double program DPGM may be set to 2. In other words, in program loops in which there are relatively many memory cells of the erase state, the maximum number of times MAXn of the double program DPGM may be set to be small, and in program loops in which there are relatively few memory cells of the erase state, the maximum number of times MAXn of the double program DPGM may be set to be large.

In addition, since there are many memory cells of the erase state in the first section 1RG, the program voltages may be set to be increased gradually by a first step voltage 1Vst. Since the number of memory cells of the erase state in the second section 2RG is less than the number of memory cells of the erase state in the first section 1RG, the program voltages may be set to be increased gradually by a second step voltage 2Vst lower than the first step voltage 1Vst. Since the number of memory cells of the erase state in the third section 3RG is less than the number of memory cells of the erase state in the second section 2RG, the program voltages may be set to be increased gradually by a third step voltage 3Vst lower than the second step voltage 2Vst. That is, a slope GDR at which the program voltage increases may be determined according to the step voltage Vst, and the maximum number of times of the double program DPGM may be changed according to the slope GDR of the program voltage.

FIGS. 18A and 18B are diagrams illustrating a program operation according to a fourth embodiment of the present disclosure.

Referring to FIGS. 18A and 18B, in the fourth embodiment, the maximum number of times MAXn of the double program DPGM may be set differently according to target voltages PV. For example, when the target voltage PV is equal to or lower than a reference level, the maximum number of times MAXn the double program DPGM is applied may be set to be small, and when the target voltage PV is higher than the reference level, the maximum number of times MAXn the double program DPGM is applied may be set to be large. Here, one or more reference levels may be set. Alternatively, as a level of the target voltage is decreased, the maximum number of times MAXn the double program DPGM is applied may be set to be small, and as the level of the target voltage is increased, the maximum number of times MAXn the double program DPGM is applied may be set to be large. For example, assuming that a fourth target voltage PV4 is the reference level, during a program operation of first to fourth target voltages PV1 to PV4, the maximum number of times MAXn of the double program DPGM may be set to L number of times, and during a program operation of fifth to seventh target voltages PV5 to PV7, the maximum number of times MAXn of the double program DPGM may be set to N number of times greater than L number of times (refer to FIG. 18A).

Alternatively, assuming that first, third, and fifth target voltages PV1, PV3, and PV5 are reference levels, during a program operation of the first target voltage PV1, the maximum number of times MAXn of the double program DPGM may be set to L number of times, during a program operation of the second and third target voltages PV2 and PV3, the maximum number of times MAXn of the double program DPGM may be set to M number of times greater than L number of times, during a program operation of the fourth and fifth target voltages PV4 and PV5, the maximum number of times MAXn of the double program DPGM may be set to N number of times greater than M number of times, and during a program operation of the sixth and seventh target voltages PV6 and PV7, the maximum number of times MAXn of the double program DPGM may be set to P number of times greater than N number of times (refer to FIG. 18B).

The first to third embodiments described above may be selectively applied or mixed and applied during the program operation, and the maximum number of times MAXn of the double program DPGM may also be variously changed in addition to the embodiments described above.

Figure 19:
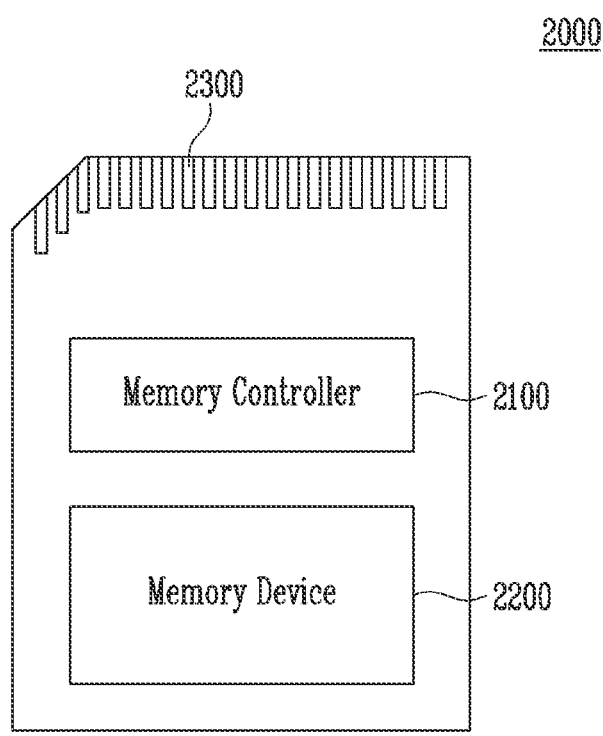
FIG. 19 is a diagram illustrating a memory card system to which a memory device of the present disclosure is applied.

FIG. 19 is a diagram illustrating a memory card system to which a memory device of the present disclosure is applied.

Referring to FIG. 19, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control a program, read, or erase operation of the memory device 2200 or control a background operation. The memory controller 2100 is configured to provide an interface between the memory device 2200 and a host. The memory controller 2100 is configured to drive firmware for controlling the memory device 2200. The memory device 2200 may be configured identically to the memory device MD described with reference to FIG. 2.

The memory controller 2100 may communicate with an external device through the connector 2300. The memory controller 2100 may communicate with the external device (for example, the host) according to a specific communication standard. For example, the memory controller 2100 is configured to communicate with the external device through at least one of various communication standards such as a universal serial bus (USB), a multimedia card (MMC), an embedded MMC (eMMC), peripheral component interconnection (PCI), PCI-express (PCI-E), advanced technology attachment (ATA), serial-ATA, parallel-ATA, a small computer system interface (SCSI), an enhanced small disk interface (ESDI), integrated drive electronics (IDE), f rewire, a universal flash storage (UFS), WIFI, Bluetooth, and NVMe. For example, the connector 2300 may be defined by at least one of the various communication standards described above.

For example, the memory device 2200 may be configured of various nonvolatile memory devices such as an electrically erasable and programmable ROM (EEPROM), a NAND flash memory, a NOR flash memory, a phase-change RAM (PRAM), a resistive RAM (ReRAM), ferroelectric RAM (FRAM), and a spin transfer torque-magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 20:
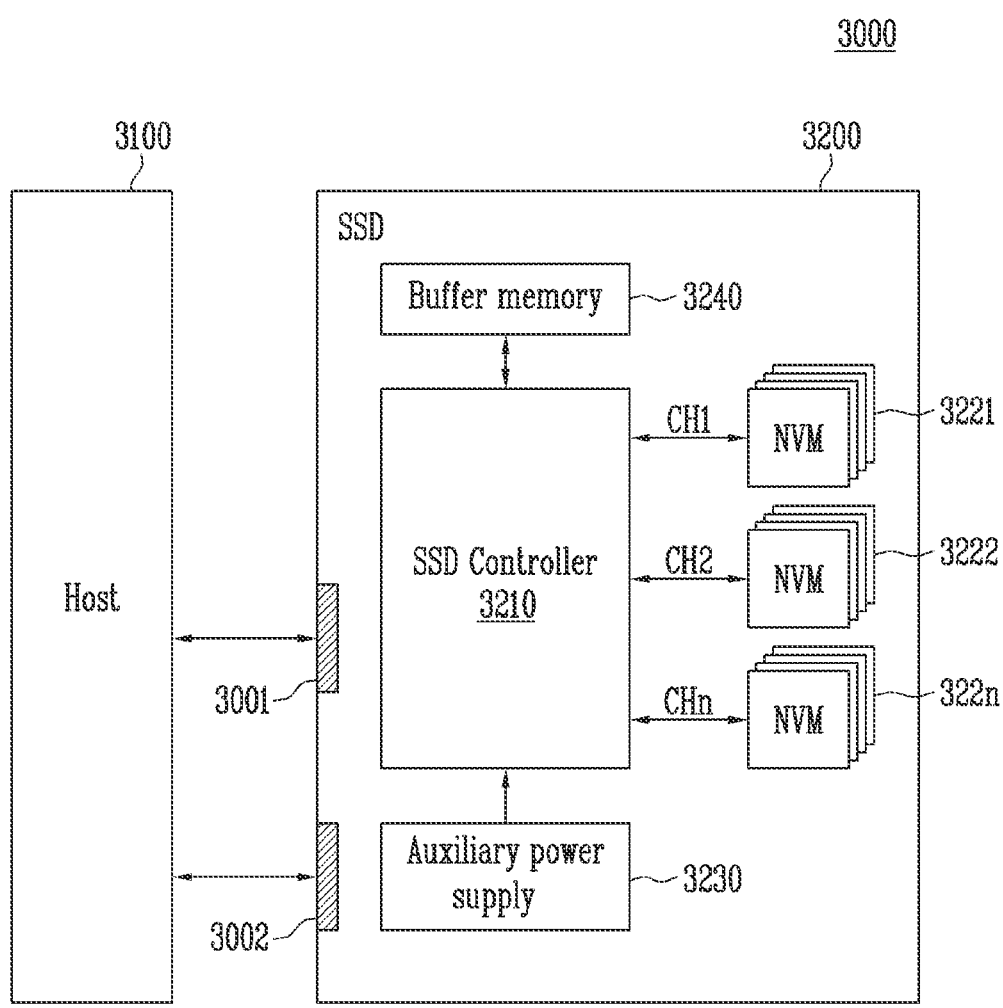
FIG. 20 is a diagram illustrating a solid state drive (SSD) system to which a memory device of the present disclosure is applied.

FIG. 20 is a diagram illustrating a solid state drive (SSD) system to which a memory device of the present disclosure is applied.

Referring to FIG. 20, the SSD system 3000 includes a host 3100 and an SSD 3200. The SSD 3200 exchanges a signal with the host 3100 through a signal connector 3001 and receives power through a power connector 3002. The SSD 3200 includes an SSD controller 3210, a plurality of flash memories 3221 to 322$n$, an auxiliary power supply 3230, and a buffer memory 3240.

According to an embodiment of the present disclosure, the flash memories 3221 to 322$n$ may be configured identically to the memory device MD described with reference to FIG. 2.

The SSD controller 3210 may control the plurality of flash memories 3221 to 322$n$ in response to the signal received from the host 3100. For example, the signal may be signals based on an interface between the host 3100 and the SSD 3200. For example, the signal may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power supply 3230 is connected to the host 3100 through the power connector 3002. The auxiliary power supply 3230 may receive the power from the host 3100 and may charge the power. The auxiliary power supply 3230 may provide power of the SSD 3200 when power supply from the host 3100 is not smooth. For example, the auxiliary power supply 3230 may be positioned in the SSD 3200 or may be positioned outside the SSD 3200, For example, the auxiliary power supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322$n$, or may temporarily store metadata (for example, a mapping table) of the flash memories 3221 to 322$n$. The buffer memory 3240 may include a volatile memory such as a DRAM, an SDRAM, a DDR SDRAM, and an LPDDR SDRAM, or nonvolatile memories such as an FRAM, a ReRAM, an STT-MRAM, and a PRAM.

What is claimed is:

1. A memory device comprising:
   a memory block including memory cells;
   a peripheral circuit configured to perform a plurality of program loops to cause a threshold voltage of selected memory cells included in a selected page among the memory cells to attain a target voltage; and
   a control logic circuit configured to control the peripheral circuit to perform the program loops by selectively applying a normal program or a double program to the program loops, and changing a maximum number of times the double program is applied according to an operation condition of the program loops,
   wherein the operation condition includes at least one of program voltages, step voltages, sections of the program loops, and target voltages, wherein the normal program increases the threshold voltage of the selected memory cells by a first change amount, wherein the double program increases the threshold voltage by a second change amount lower than the first change amount, and wherein the normal program is applied to the program loops in which the double program is not applied, wherein the peripheral circuit comprises:

a voltage generator configured to generate a program voltage or a verify voltage to be applied to a selected word line connected to the selected memory cells; and page buffers configured to sense the threshold voltage of the selected memory cells through bit lines connected to the memory cells, and apply a program allowance voltage, a program decrease voltage, or a program inhibition voltage to the bit lines according to sensed data, wherein in the program loop to which the double program is used, the program inhibition voltage is applied to bit lines connected to memory cells of which the threshold voltage is higher than the target voltage, the program decrease voltage is applied to bit lines connected to memory cells of which the threshold voltage is between the target voltage and a sub verify voltage lower than the target voltage, and the program allowance voltage is applied to bit lines connected to memory cells of which the threshold voltage is lower than the sub verify voltage.

2. The memory device of claim 1, wherein the program decrease voltage is set to be higher than the program allowance voltage, and the program inhibition voltage is set to be higher than the program decrease voltage.

3. The memory device of claim 2, wherein in the program loop to which the normal program is applied, the program inhibition voltage is applied to bit lines connected to memory cells of which the threshold voltage is higher than the target voltage, and the program allowance voltage is applied to bit lines connected to memory cells of which the threshold voltage is lower than the target voltage.

4. The memory device of claim 1, wherein the control logic circuit changes the maximum number of times the double program is used according to a program voltage applied to a selected word line connected to the selected memory cells among the operation conditions of the program loops.

5. The memory device of claim 4, wherein the control logic circuit decreases the maximum number of times the double program is used in the program loops in which the program voltage is equal to or lower than a reference level, and increases the maximum number of times the double program is used in the program loops in which the program voltage is greater than the reference level.

6. The memory device of claim 1, wherein the control logic circuit changes the maximum number of times the double program is used according to the step voltage that is a change amount of a program voltage applied to a selected word line connected to the selected memory cells among the operation conditions of the program loops.

7. The memory device of claim 6, wherein the control logic circuit increases the maximum number of times the double program is used in the program loops in which the step voltage is relatively high, and decreases the maximum number of times the double program is used in the program loops in which the step voltage is relatively low.

8. The memory device of claim 1, wherein the control logic circuit changes the maximum number of times the double program is used according to the target voltage of the selected memory cells among the operation conditions of the program loops.

9. The memory device of claim 8, wherein the control logic circuit decreases the maximum number of times the double program is used in the program loops in which the target voltage is equal to or lower than a reference level, and increases the maximum number of times the double program is used in the program loops in which the target voltage is greater than the reference level.

10. A method of operating a memory device, the method comprising:

performing a plurality of program loops of programming selected memory cells by applying a program voltage, that increases, to a selected word line to which the selected memory cells are connected, wherein when the program voltage is equal to or lower than a reference level, a maximum number of times a double program for increasing a threshold voltage between a target voltage and a sub verify voltage lower than the target voltage slower than a reference is used is set as a first number of times, and when the program voltage is higher than the reference level, the maximum number of times is set as a second number of times greater than the first number of times.

11. The method of claim 10, wherein each of the plurality of program loops comprises:

applying a program allowance voltage, a program decrease voltage, or a program inhibition voltage to bit lines connected to the selected memory cells;

applying the program voltage to the selected word lines; and verifying the threshold voltage of the selected memory cells.

12. The method of claim 11, wherein when the double program is used, the program allowance voltage, the program decrease voltage, or the program inhibition voltage is applied to the bit lines, and when the double program is not used, the program allowance voltage or the program inhibition voltage is applied to the bit lines.

13. The method of claim 12, wherein when the double program is used, the program inhibition voltage is applied to bit lines connected to memory cells of which the threshold voltage is higher than the target voltage, the program decrease voltage is applied to bit lines connected to memory cells of which the threshold voltage is between the sub verify voltage and the target voltage, and the program allowance voltage is applied to bit lines connected to memory cells of which the threshold voltage is lower than the sub verify voltage.

14. The method of claim 12, wherein when the double program is not used, the program inhibition voltage is applied to bit lines connected to memory cells of which the threshold voltage is higher than the target voltage, and the program allowance voltage is applied to bit lines connected to memory cells of which the threshold voltage is lower than the target voltage.

15. A method of operating a memory device, the method comprising:

performing a program operation of selected memory cells by applying a program voltage, that increases, to a selected word line to which the selected memory cells are connected, wherein in an initial period of the program operation, a maximum number of times a double program for increasing a threshold voltage between a target voltage and a sub verify voltage lower than the target voltage slower than a reference is used is set as a first number of times, and the maximum number of times is increased to a second number of times greater than the first number of times as the program operation proceeds.

16. The method of claim 15, wherein each of a plurality of program loops comprises:
   applying a program allowance voltage, a program decrease voltage, or a program inhibition voltage to bit lines connected to the selected memory cells;
   applying the program voltage to the selected word lines; and
   verifying the threshold voltage of the selected memory cells.

17. The method of claim 16, wherein when the double program is used, the program allowance voltage, the program decrease voltage, or the program inhibition voltage is applied to the bit lines, and
   when the double program is not used, the program allowance voltage or the program inhibition voltage is applied to the bit lines.

18. The method of claim 17, wherein when the double program is used,
   the program inhibition voltage is applied to bit lines connected to memory cells of which the threshold voltage is higher than the target voltage,
   the program decrease voltage is applied to bit lines connected to memory cells of which the threshold voltage is between the sub verify voltage and the target voltage, and
   the program allowance voltage is applied to bit lines connected to memory cells of which the threshold voltage is lower than the sub verify voltage.

19. The method of claim 17, wherein when the double program is not used,
   the program inhibition voltage is applied to bit lines connected to memory cells of which the threshold voltage is higher than the target voltage, and
   the program allowance voltage is applied to bit lines connected to memory cells of which the threshold voltage is lower than the target voltage.

20. A method of operating a memory device, the method comprising:
   performing a plurality of program loops of programming selected memory cells by applying a program voltage, that increases, to a selected word line to which the selected memory cells are connected,
   wherein when a target voltage of the memory cells is equal to or lower than a reference level, a maximum number of times a double program for increasing a threshold voltage between the target voltage and a sub verify voltage lower than the target voltage slower than a reference is used is set as a first number of times, and
   when the target voltage of the memory cells is higher than the reference level, the maximum number of times is set as a second number of times greater than the first number of times.

21. The method of claim 20, wherein each of the plurality of program loops comprises:
   applying a program allowance voltage, a program decrease voltage, or a program inhibition voltage to bit lines connected to the selected memory cells;
   applying the program voltage to the selected word lines; and
   verifying the threshold voltage of the selected memory cells.

22. The method of claim 21, wherein when the double program is used, the program allowance voltage, the program decrease voltage, or the program inhibition voltage is applied to the bit lines, and
   when the double program is not used, the program allowance voltage or the program inhibition voltage is applied to the bit lines.

23. The method of claim 22, wherein when the double program is used,
   the program inhibition voltage is applied to bit lines connected to memory cells of which the threshold voltage is higher than the target voltage,
   the program decrease voltage is applied to bit lines connected to memory cells of which the threshold voltage is between the sub verify voltage and the target voltage, and
   the program allowance voltage is applied to bit lines connected to memory cells of which the threshold voltage is lower than the sub verify voltage.

24. The method of claim 22, wherein when the double program is not used,
   the program inhibition voltage is applied to bit lines connected to memory cells of which the threshold voltage is higher than the target voltage, and
   the program allowance voltage is applied to bit lines connected to memory cells of which the threshold voltage is lower than the target voltage.

* * * * *